US011066744B2

(12) United States Patent
Horita et al.

(10) Patent No.: US 11,066,744 B2
(45) Date of Patent: Jul. 20, 2021

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Hideki Horita, Toyama (JP); Tatsuya Yotsutani, Toyama (JP); Takashi Ozaki, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 50 days.

(21) Appl. No.: 16/518,899

(22) Filed: Jul. 22, 2019

(65) Prior Publication Data

US 2020/0024731 A1 Jan. 23, 2020

(30) Foreign Application Priority Data

Jul. 23, 2018 (JP) .............................. JP2018-137871

(51) Int. Cl.
*C23C 16/30* (2006.01)
*H01L 21/02* (2006.01)
(Continued)

(52) U.S. Cl.
CPC .......... *C23C 16/308* (2013.01); *C23C 16/455* (2013.01); *C23C 16/52* (2013.01); *H01L 21/0214* (2013.01); *H01L 21/0228* (2013.01)

(58) Field of Classification Search
CPC ..... C23C 16/308; C23C 16/455; C23C 16/52; H01L 21/0214; H01L 21/0228
See application file for complete search history.

(56) References Cited

U.S. PATENT DOCUMENTS 6,248,669 B1* 6/2001 Ichikawa ................. G03F 7/09
257/E21.027
2007/0010071 A1 1/2007 Matsuura
(Continued)

FOREIGN PATENT DOCUMENTS

JP 6084298 A2 3/1994
JP 2007-019145 A 1/2007
(Continued)

OTHER PUBLICATIONS

Taiwanese Office Action dated May 4, 2020 for the Taiwanese Patent Application No. 108125378.
(Continued)

*Primary Examiner* — Mohammad M Choudhry
(74) *Attorney, Agent, or Firm* — Volpe Koenig

(57) ABSTRACT

There is provided a technique that includes: forming an oxynitride film on at least one substrate by performing a cycle a predetermined number of times, the cycle including non-simultaneously performing: (a) supplying a precursor from a precursor supply part to the at least one substrate; (b) supplying an oxidizing agent from an oxidizing agent supply part to the at least one substrate; and (c) supplying a nitriding agent from a nitriding agent supply part to the at least one substrate, wherein in (b), an inert gas is supplied from an inert gas supply part, which is different from the oxidizing agent supply part, to the at least one substrate, and at least one of nitrogen concentration and refractive index of the oxynitride film formed on the at least one substrate is adjusted by controlling a flow rate of the inert gas.

17 Claims, 14 Drawing Sheets

(51) Int. Cl.
      *C23C 16/455*     (2006.01)
      *C23C 16/52*     (2006.01)

(56) References Cited

U.S. PATENT DOCUMENTS

| | | |
|---|---|---|
| 2008/0102613 A1 | 5/2008 | Elers |
| 2015/0072537 A1* | 3/2015 | Noda ................ C23C 16/45523 438/786 |
| 2017/0298508 A1 | 10/2017 | Yamakoshi et al. |
| 2017/0338109 A1 | 11/2017 | Lei et al. |
| 2018/0076017 A1 | 3/2018 | Hashimoto et al. |

FOREIGN PATENT DOCUMENTS

| | | |
|---|---|---|
| JP | 6084298 B2 | 2/2017 |
| JP | 2018-046129 A | 3/2018 |
| KR | 10-2017-0093919 A | 8/2017 |
| WO | 2016/110956 A1 | 8/2017 |

OTHER PUBLICATIONS

Korean Office Action dated Jul. 29, 2020 for Korean Patent Application No. 10-2019-0088189.
Japanese Office Action dated Mar. 9, 2021 for Japanese Patent Application No. 2018-137871.

* cited by examiner

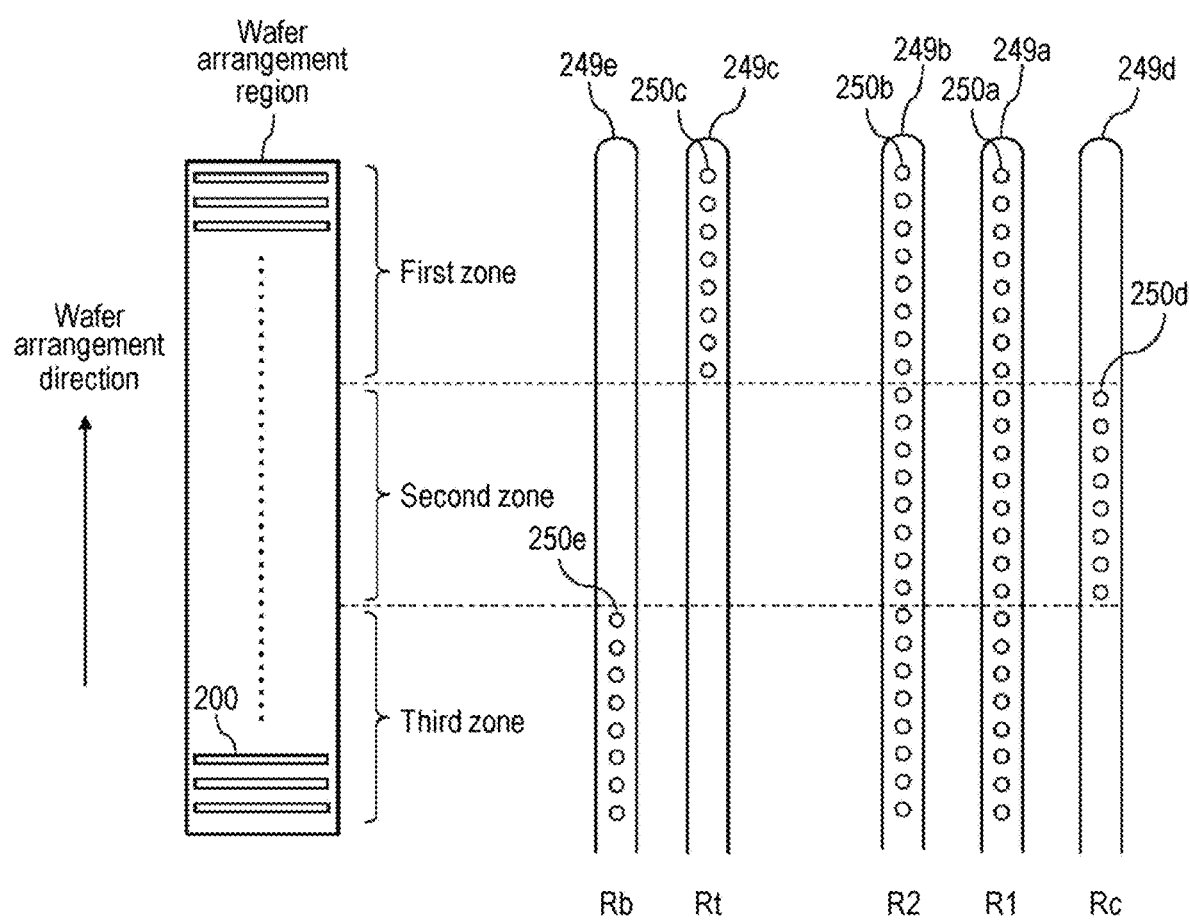

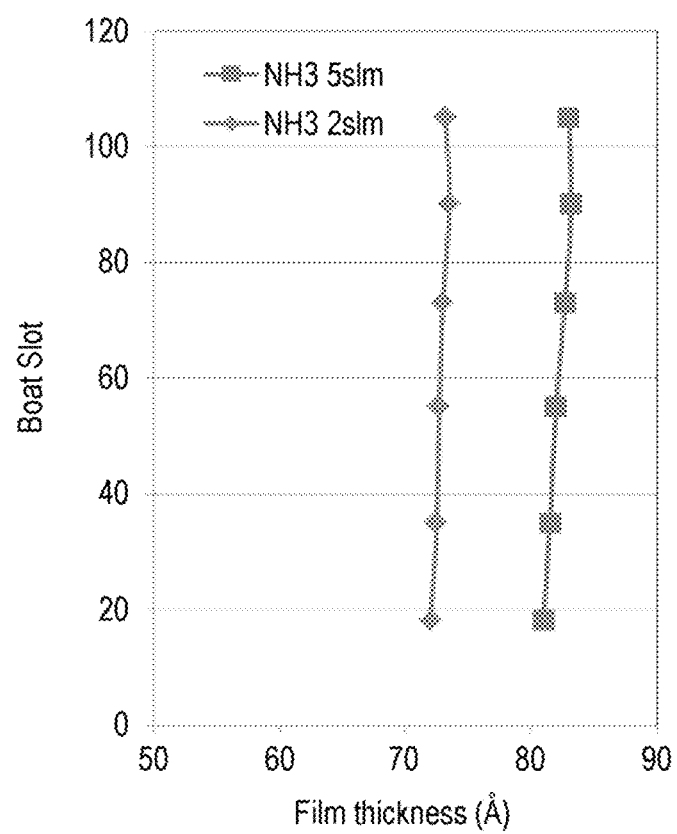

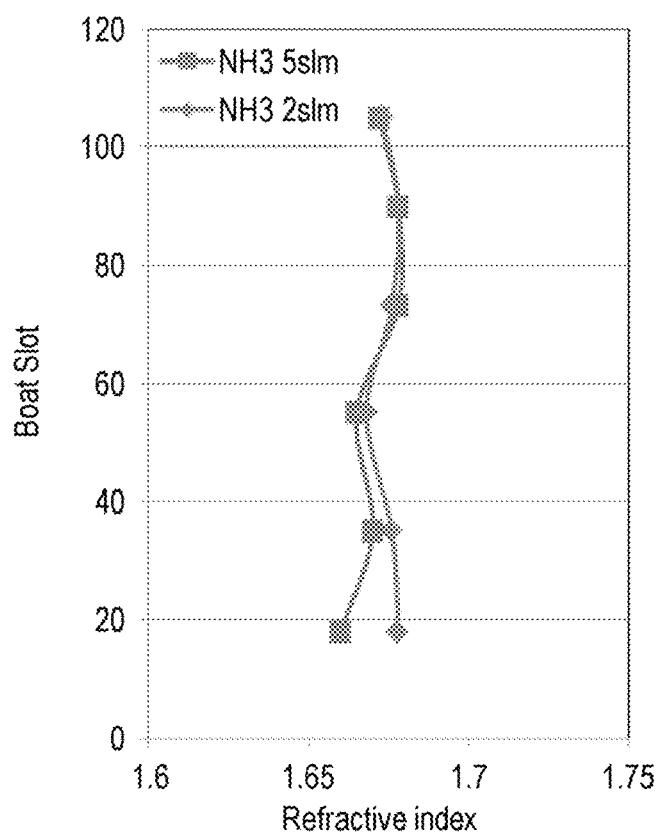

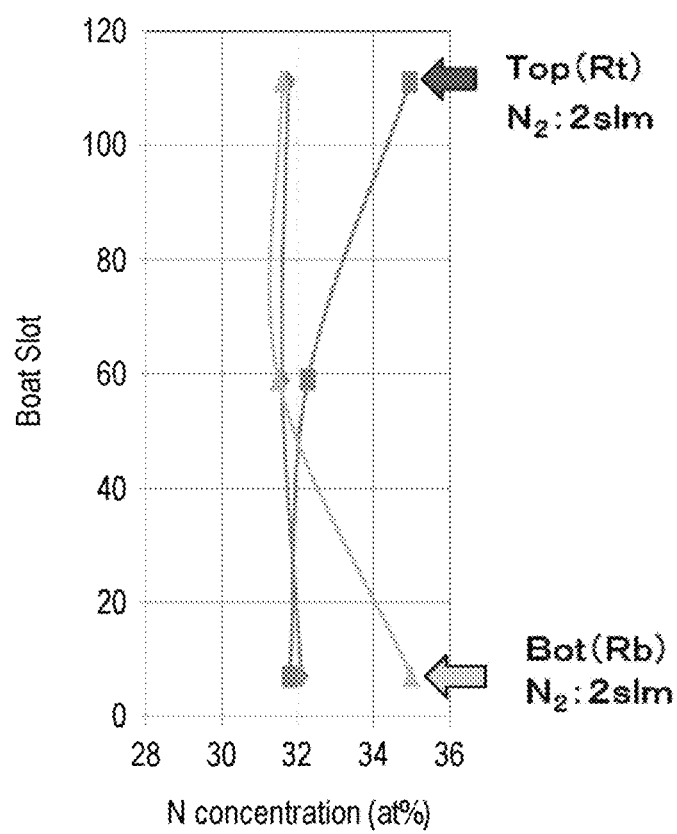

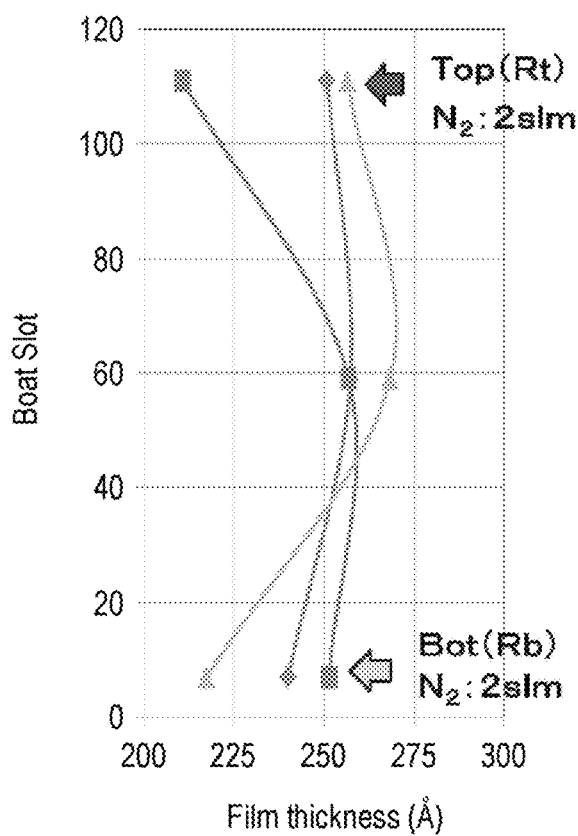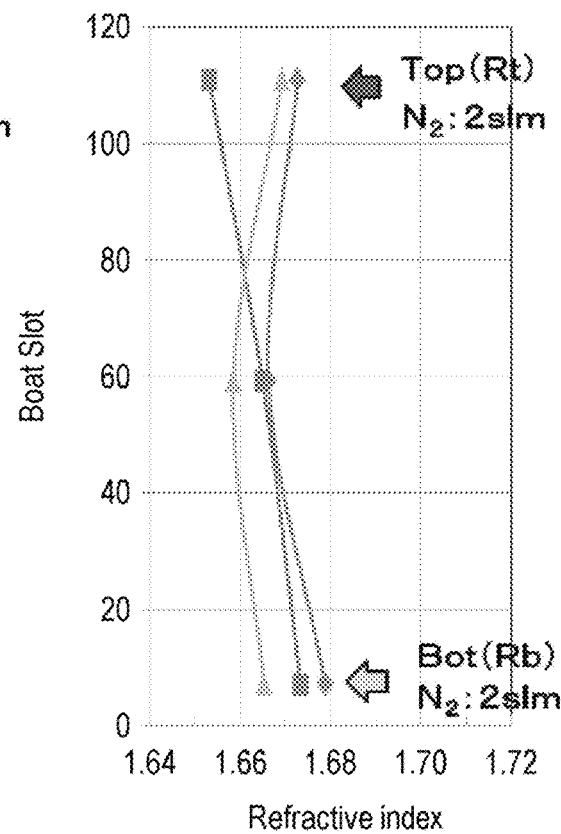

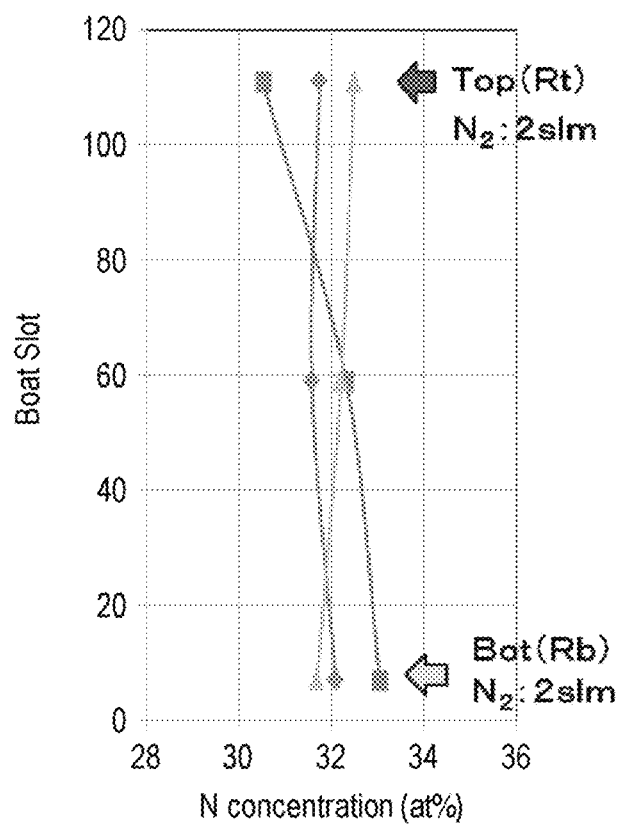

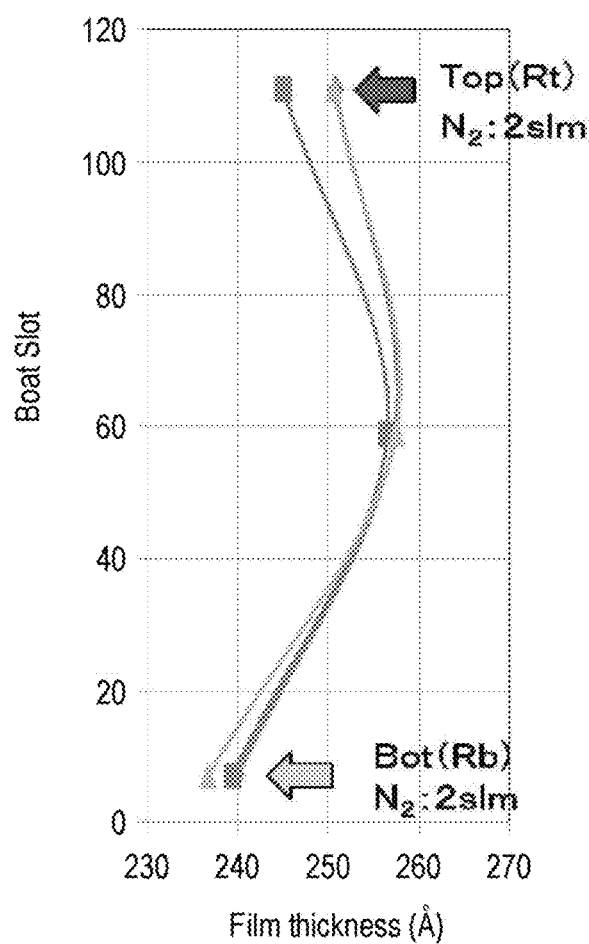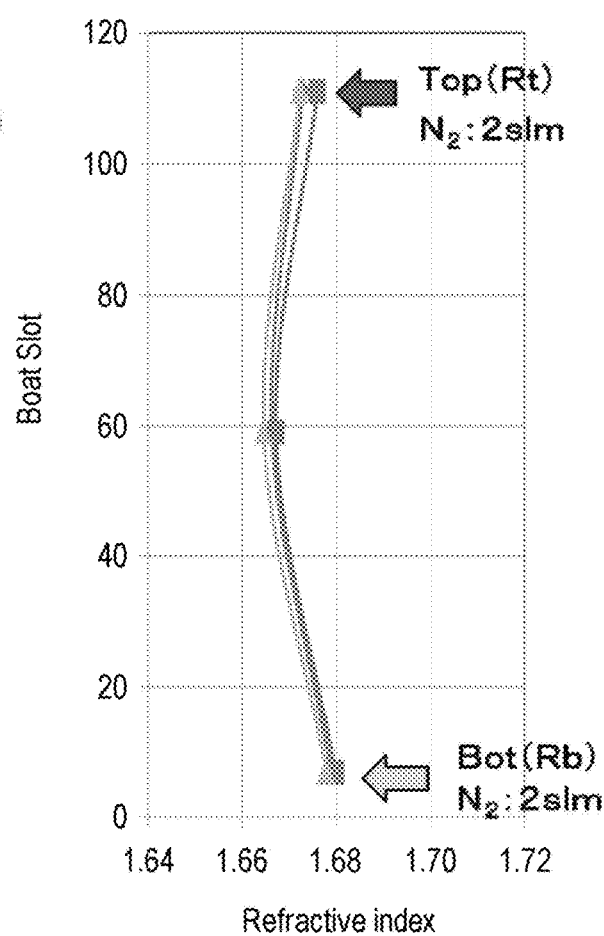

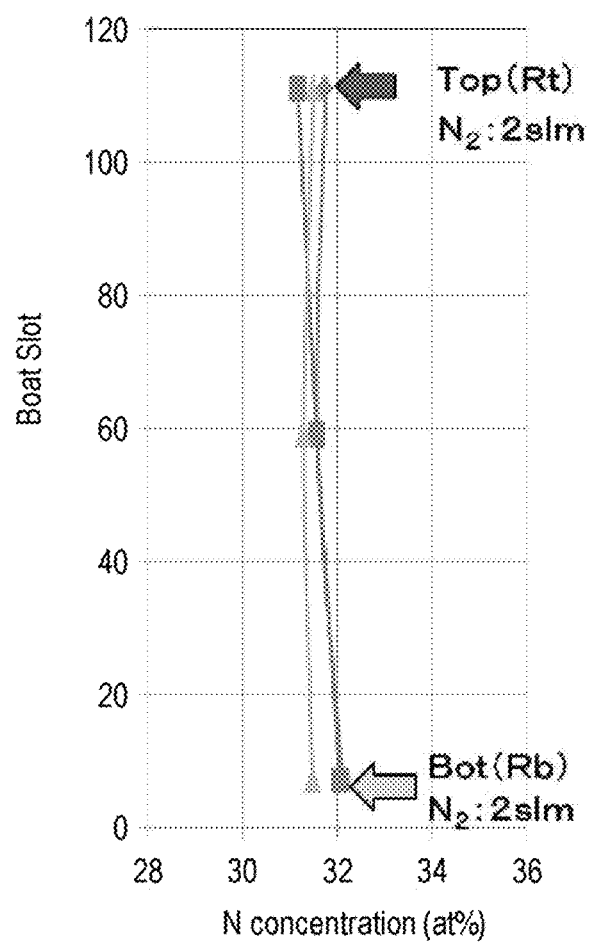

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION(S)

This application is based upon and claims the benefit of priority from Japanese Patent Application No. 2018-137871, filed on Jul. 23, 2018, the entire contents of which are incorporated herein by reference.

TECHNICAL FIELD

The present disclosure relates to a substrate processing apparatus for processing a substrate, a method of manufacturing a semiconductor device, and a recording medium.

BACKGROUND

In a related art, as an example of processes of manufacturing a semiconductor device, a process of forming an oxynitride film on a substrate is often carried out by supplying a precursor, an oxidizing agent, and a nitriding agent to the substrate.

SUMMARY

The present disclosure provides some embodiments of a technique capable of controlling at least one of nitrogen concentration and refractive index of an oxynitride film formed on a substrate.

According to one embodiment of the present disclosure, there is provided a technique, which includes:forming an oxynitride film on at least one substrate by performing a cycle a predetermined number of times, the cycle including non-simultaneously performing: (a) supplying a precursor from a precursor supply part to the substrate; (b) supplying an oxidizing agent from an oxidizing agent supply part to the substrate; and (c) supplying a nitriding agent from a nitriding agent supply part to the substrate, wherein in (b), an inert gas is supplied from an inert gas supply part, which is different from the oxidizing agent supply part, to the substrate, and at least one of nitrogen concentration and refractive index of the oxynitride film formed on the substrate is adjusted by controlling a flow rate of the inert gas.

BRIEF DESCRIPTION OF DRAWINGS

FIG. 6 is a schematic configuration view of a nozzle suitably used in an embodiment of the present disclosure.

FIG. 7A is a diagram illustrating a measurement result of film thickness of an oxynitride film formed on a substrate, and FIG. 7B is a diagram illustrating a measurement result of refractive index of an oxynitride film formed on the substrate.

FIG. 8C is a diagram illustrating a measurement result of nitrogen concentration of an oxynitride film formed on the substrate.

FIG. 9A is a diagram illustrating a measurement result of film thickness of an oxynitride film formed on a substrate, FIG. 9B is a diagram illustrating a measurement result of refractive index of an oxynitride film formed on the substrate, and FIG. 9C is a diagram illustrating a measurement result of nitrogen concentration of an oxynitride film formed on the substrate.

FIG. 10A is a diagram illustrating a measurement result of film thickness of an oxynitride film formed on a substrate, FIG. 10B is a diagram illustrating a measurement result of refractive index of an oxynitride film formed on the substrate, and FIG. 10C is a diagram illustrating a measurement result of nitrogen concentration of an oxynitride film formed on the substrate.

DETAILED DESCRIPTION

<One Embodiment of the Present Disclosure>

An embodiment of the present disclosure will now be described with reference to FIGS. 1 to 6, and the like.

(1) Configuration of the Substrate Processing Apparatus

Figure 1:
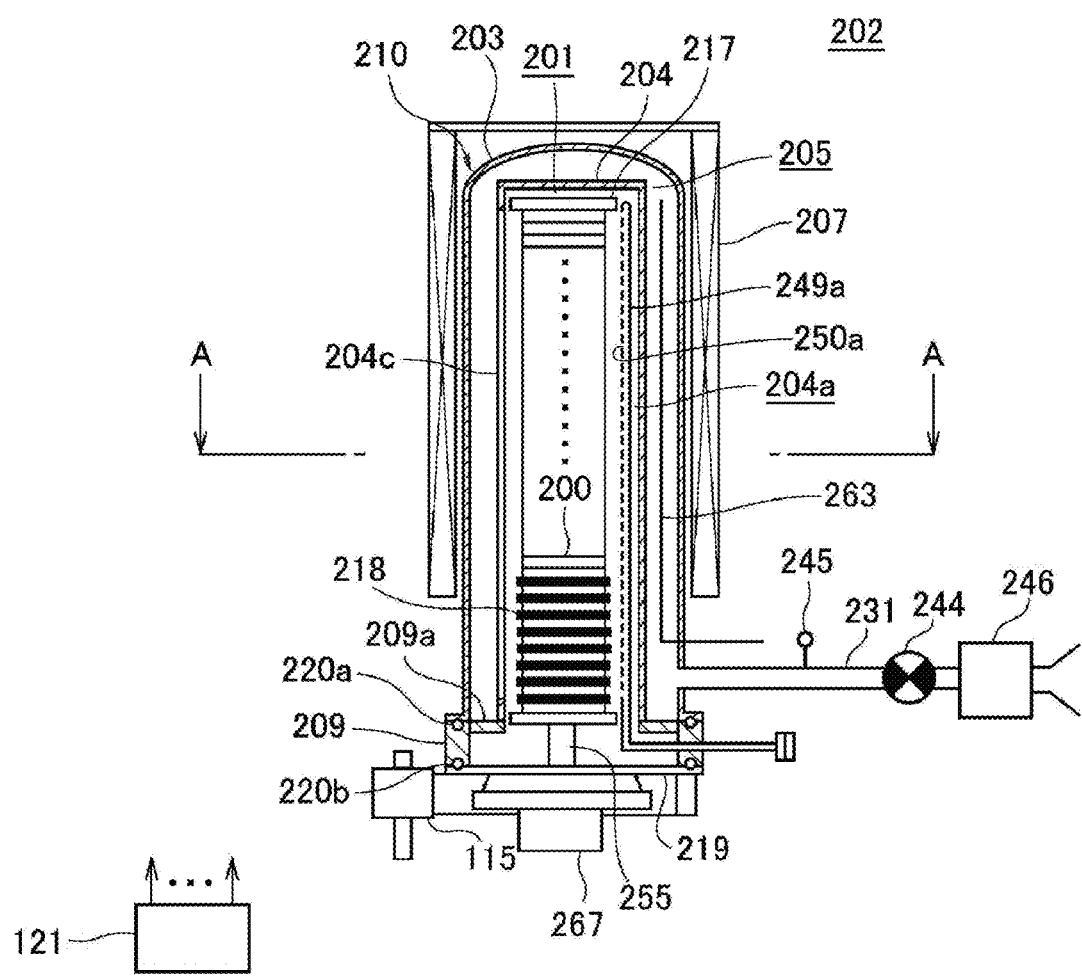
FIG. 1 is a schematic configuration diagram of a vertical type process furnace of a substrate processing apparatus suitably used in an embodiment of the present disclosure, in which a portion of the process furnace is shown in a vertical cross sectional view.

As illustrated in FIG. 1, a process furnace 202 includes a heater 207 as a heating mechanism (temperature adjustment part). The heater 207 has a cylindrical shape and is supported by a holding plate so as to be vertically installed. The heater 207 functions as an activation mechanism (an excitation part) configured to thermally activate (excite) a gas.

A reaction tube 210 is disposed inside the heater 207 so as to be concentric with the heater 207. The reaction tube 210 has a double tube configuration including an inner tube 204 as an inner reaction tube and an outer tube 203 as an outer reaction tube concentrically surrounding the inner tube 204. Each of the inner tube 204 and the outer tube 203 is made of a heat resistant material, e.g., quartz ($SiO_2$), silicon carbide (SiC) or the like, and has a cylindrical shape with its upper end closed and its lower end opened.

A process chamber 201 in which wafers 200 as substrates are processed is formed in a hollow cylindrical portion of the inner tube 204. The process chamber 201 is configured to accommodate the wafers 200 in such a state that the wafers 200 are arranged between one end side (lower side) and the other end side (upper side) in the process chamber 201. A region in which a plurality of wafers 200 are arranged in the process chamber 201 will be referred to as a substrate arrangement region (wafer arrangement region). Furthermore, a direction in which the wafers 200 are arranged in the process chamber 201 will be referred to as a substrate arrangement direction (a wafer arrangement direction).

Each of the inner tube 204 and the outer tube 203 is supported by a manifold 209 from below. The manifold 209 is made of a metal material, e.g., stainless steel (SUS), and has a cylindrical shape with its upper and lower ends opened. An annular flange 209a, which is made of a metal material such as SUS or the like and extends to protrude toward an inside of the manifold 209 in a radial direction thereof, is installed at an upper end of an inner wall of the manifold 209. A lower end of the inner tube 204 is configured to make contact with an upper surface of the flange 209a. A lower end of the outer tube 203 is configured to make contact with the upper end of the manifold 209. An O-ring 220a as a seal member is installed between the outer tube 203 and the manifold 209. A lower end opening of the manifold 209 is configured as a furnace opening of the process furnace 202, and is hermetically sealed by a disc-shaped seal cap 219 as a lid when a boat 217 is lifted up by a boat elevator 115 as described hereinbelow. An O-ring 220b as a seal member is installed between the manifold 209 and the seal cap 219.

A ceiling portion of the inner tube 204 has a flat shape, and a ceiling portion of the outer tube 203 has a dome shape. When the ceiling portion of the inner tube 204 has a dome shape, a gas supplied into the process chamber 201 is likely to flow into the internal space of the dome portion in the ceiling portion of the inner tube 204 without flowing between the plurality of wafers 200. Since the ceiling portion of the inner tube 204 has a flat shape, the gas supplied into the process chamber 201 is allowed to efficiently flow between the plurality of wafers 200. By providing a small clearance (space) between the ceiling portion of the inner tube 204 and a ceiling plate of the boat 217l, which will be described later, i.e., for example, by setting it to a substantially same size as the arrangement interval (pitch) of the wafers 200, the gas is allowed to efficiently flow between the wafers 200.

Figure 2:
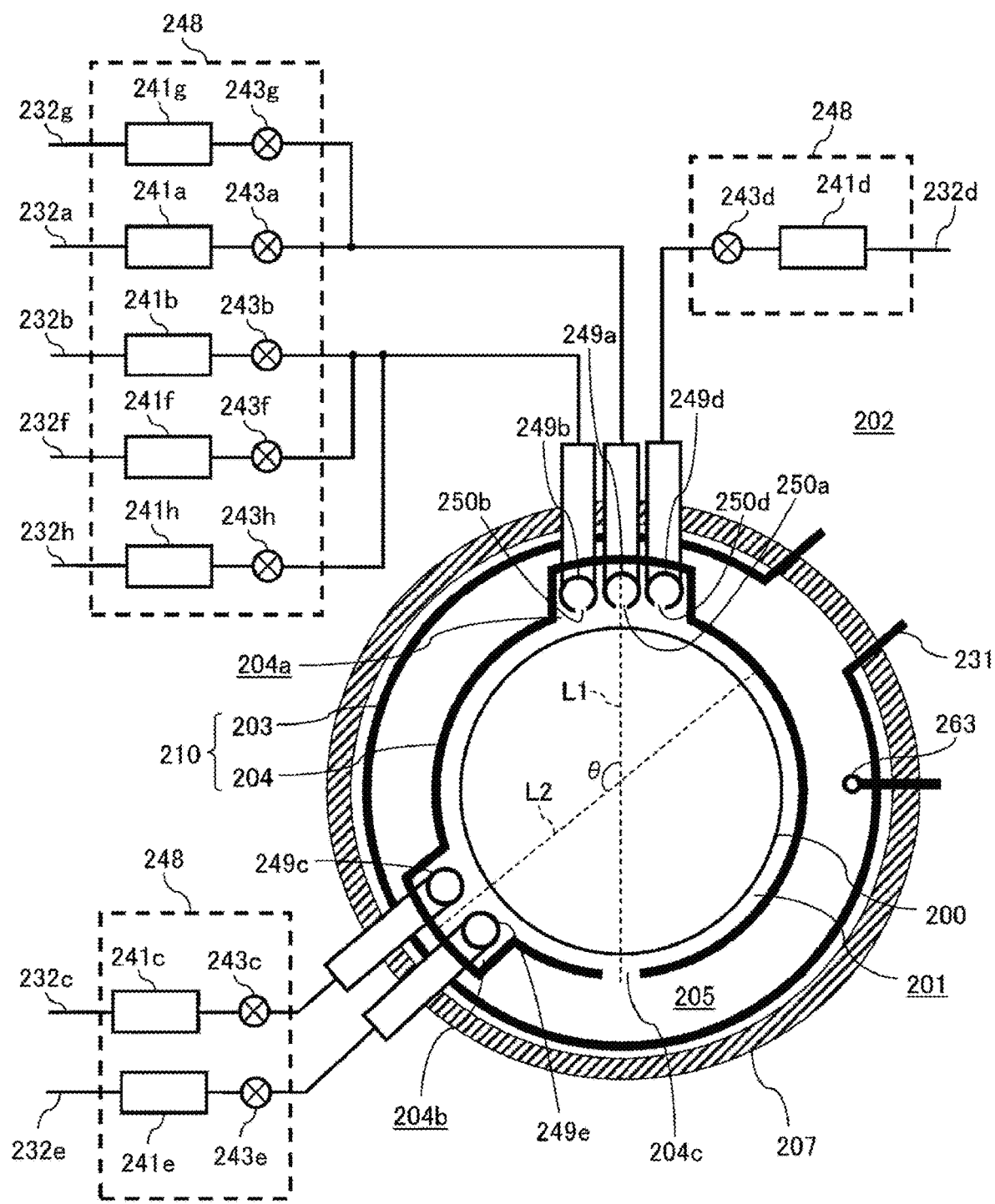
FIG. 2 is a schematic configuration diagram of a vertical type process furnace of the substrate processing apparatus suitably used in an embodiment of the present disclosure, in which a portion of the process furnace is shown in a cross sectional view taken along line A-A in FIG. 1.

As illustrated in FIG. 2, a nozzle accommodating chamber 204a for accommodating a nozzle 249a and nozzles 249b and 249d, and a nozzle accommodating chamber 204b for accommodating nozzles 249c and 249e are formed on a sidewall of the inner tube 204. Each of the nozzle accommodating chambers 204a and 204b protrudes outward of the inner tube 204 in the radial direction thereof from the sidewall of the inner tube 204, and has a channel shape extending along a vertical direction. Inner walls of the nozzle accommodating chambers 204a and 204b each constitute part of the inner wall of the process chamber 201. The nozzle accommodating chamber 204a and the nozzle accommodating chamber 204b are respectively disposed at positions spaced from each other by a predetermined distance along an inner wall of the inner tube 204, namely along the outer periphery of the wafers 200 accommodated in the process chamber 201. Specifically, the nozzle accommodating chambers 204a and 204b are respectively disposed at positions in which a central angle θ (a central angle to an arc having the respective centers of the nozzle accommodating chambers 204a and 204b as both ends) formed by a straight line L1 connecting the center of the wafers 200 accommodated in the process chamber 201 and the center of the nozzle accommodating chamber 204a and a straight line L2 connecting the center of the wafers 200 accommodated in the process chamber 201 and the center of the nozzle accommodating chamber 204b becomes equal to an angle within a range of, e.g., 30° to 150°. The nozzles 249b and 249d accommodated in the nozzle accommodating chamber 204a are disposed at both sides of the nozzle 249a interposed therebetween, i.e., so as to sandwich the nozzle 249a therebetween along the inner wall of the nozzle accommodating chamber 204a (an outer peripheral portion of the wafers 200). In the present disclosure, the nozzles 249a and 249b will be referred to as R1 and R2 in order, and the nozzles 249c, 249d, and 249e will be referred to as Rt, Rc, and Rb in order. The nozzles 249c to 249e will be referred to as Rt to Rb.

The nozzles 249a to 249e are installed to extend upward along the upper portion of the nozzle accommodating chambers 204a and 204b from the lower portion thereof, namely along the wafer arrangement direction. That is, the nozzles 249a to 249e are installed at a lateral side of the wafer arrangement region, namely in a region which horizontally surrounds the wafer arrangement region, so as to extend along the wafer arrangement region. As illustrated in FIG. 6, gas injection holes 250a to 250e as first to fifth gas supply ports are formed on the side surfaces of the nozzles 249a to 249e, respectively. The nozzles 249a to 249e are made of a heat resistant material such as, e.g., quartz or SiC.

As illustrated in FIG. 6, the wafer arrangement region described above may be regarded as being divided into a plurality of zones. In the present embodiment, a zone on one end side (here, upper side) of the wafer arrangement region in the wafer arrangement direction will be referred to as a first zone (top zone). In addition, a zone on the central side of the wafer arrangement region in the wafer arrangement direction will be referred to as a second zone (center zone). Furthermore, a zone on the other end side (here, lower side) of the wafer arrangement region in the wafer arrangement direction will be referred to as a third zone (bottom zone).

Each of the gas injection holes 250a and 250b in the nozzles 249a and 249b may be formed in a plural number between the upper portion of the nozzles 249a and 249b and the lower portion of the nozzles 249a and 249b so as to correspond to an entire region of the wafer arrangement region in the wafer arrangement direction. The nozzles 249a and 249b, i.e., R1 and R2, are each configured to supply a gas to all of the first to third zones.

A plurality of gas injection holes 250c in the nozzle 249c are formed only on the upper side of the nozzle 249c so as to correspond to a region on the upper side of the wafer arrangement region in the wafer arrangement direction, i.e., the first zone. The nozzle 249c, i.e., Rt, is configured to supply a gas to the first zone, and not to supply a gas to the other zones, i.e., the second and third zones.

A plurality of gas injection holes 250d in the nozzle 249d are formed only on the central side of the nozzle 249d so as to correspond to a region on the central side of the wafer arrangement region in the wafer arrangement direction, i.e., the second zone. The nozzle 249d, i.e., Rc, is configured to supply a gas to the second zone, and not to supply a gas to the other zones, i.e., the first and third zones.

A plurality of gas injection holes 250e in the nozzle 249e are formed only on the lower side of the nozzle 249e so as to correspond to a region on the lower side of the wafer arrangement region in the wafer arranging direction, i.e., the third zone. The nozzle 249e, i.e., Rb, is configured to supply a gas to the third zone, and not to supply a gas to the other zones, i.e., the first and second zones.

Furthermore, it is configured so that the gas injection holes 250a to 250e are opened toward the center of the process chamber 201 so as to supply a gas to the center of the wafers 200. In addition, the respective gas injection ports 250a to 250e may have the same aperture area and may be formed at the same aperture pitch.

As illustrated in FIG. 2, gas supply pipes 232a to 232e are connected to the nozzles 249a to 249e, respectively. Mass flow controllers (MFCs) 241a to 241e, which are flow rate controllers (flow rate control parts), and valves 243a to 243e, which are opening/closing valves, are installed in the gas supply pipes 232a to 232e sequentially from the corresponding upstream sides of gas flow, respectively. A gas supply pipe 232g is connected to the gas supply pipe 232a at the downstream side of the valve 243a. An MFC 241g and a valve 243g are respectively installed in the gas supply pipe 232g sequentially from the corresponding upstream side of gas flow. Gas supply pipes 232f and 232h are connected to the gas supply pipe 232b at the downstream side of the valve 243b. MFCs 241f and 241h and valves 243f and 243h are respectively installed in the gas supply pipes 232f and 232h sequentially from the corresponding upstream sides of gas flow. The gas supply pipes 232a to 232h are made of a metal material such as, e.g., SUS or the like.

A halosilane-based gas, which contains silicon (Si) and a halogen element as main elements constituting a film to be formed, is supplied as a precursor (precursor gas) from the gas supply pipe 232a into the process chamber 201 via the MFC 241a, the valve 243a, and the nozzle 249a.

The precursor gas refers to a gaseous precursor, for example, a gas obtained by vaporizing a precursor which remains in a liquid state under a room temperature and an atmospheric pressure, or a precursor which remains in a gas state under a room temperature and an atmospheric pressure. The halosilane-based gas is a silane-based gas having a halogen group. The halogen group includes halogen elements such as chlorine (Cl), fluorine (F), bromine (Br), iodine (I), and the like. As the halosilane-based gas, it may be possible to use, for example, a precursor gas containing Si and Cl, i.e., a chlorosilane-based gas. The chlorosilane-based gas acts as a Si source. As the chlorosilane-based gas, it may be possible to use, for example, a hexachlorodisilane ($Si_2Cl_6$, abbreviation: HCDS) gas.

An oxygen (O)-containing gas acting as an oxidizing agent (oxidizing gas), as a reactant (reaction gas), is supplied from the gas supply pipe 232b into the process chamber 201 via the MFC 241b, the valve 243b, and the nozzle 249b. The O-containing gas acts as an O source. As the O-containing gas, it may be possible to use, for example, an oxygen ($O_2$) gas.

A nitrogen (N)-containing gas acting as a nitriding agent (nitriding gas), as a reactant (reaction gas), is supplied from the gas supply pipe 232f into the process chamber 201 via the MFC 241f, the valve 243f, the gas supply pipe 232b, and the nozzle 249b. The N-containing gas acts as an N source. As the N-containing gas, it may be possible to use, for example, an ammonia ($NH_3$) gas which is a hydrogen nitride-based gas.

An inert gas is supplied from the gas supply pipes 232c to 232e into the process chamber 201 via the MFCs 241c to 241e, the valves 243c to 243e, and the nozzles 249c to 249e. Furthermore, an inert gas is supplied from the gas supply pipes 232g and 232h into the process chamber 201 via the MFCs 241g and 241h, the valves 243g and 243h, the gas supply pipes 232a and 232b, and the nozzles 249a and 249b. An $N_2$ gas supplied from the nozzles 249c to 249e into the process chamber 201 mainly acts as a control gas for adjusting at least one of nitrogen concentration and refractive index of an oxynitride film formed on the wafer 200. In addition, an $N_2$ gas supplied from the nozzles 249a and 249b into the process chamber 201 mainly acts as a purge gas, a carrier gas, or a dilution gas. As the inert gas, it may be possible to use, for example, a nitrogen ($N_2$) gas.

A precursor supply system is mainly constituted by the gas supply pipe 232a, the MFC 241a, and the valve 243a. An oxidizing agent supply system is mainly constituted by the gas supply pipe 232b, the MFC 241b, and the valve 243b. A nitriding agent supply system is mainly constituted by the gas supply pipe 232f, the MFC 241f, and the valve 243f. An inert gas supply system is mainly constituted by the gas supply pipes 232c to 232e, 232g and 232h, the MFCs 241c to 241e, 241g and 241h, and the valves 243c to 243e, 243g and 243h.

The nozzle 249a that supplies a precursor will be referred to as a precursor supply part. When an oxidizing agent is supplied from the nozzle 249b, the nozzle 249b will be referred to as an oxidizing agent supply part. When a nitriding agent is supplied from the nozzle 249b, the nozzle 249b will be referred to as a nitriding agent supply part. The nozzles 249c to 249e that supply an inert gas will be generally referred to as an inert gas supply part. The nozzles 249c to 249e will be referred to as first to third supply parts in order. The inert gas supply part is a supply part different from the precursor supply part, the oxidizing agent supply part, and the nitriding agent supply part, and has a plurality of supply parts referred to as first to third supply parts. When an inert gas is supplied from the nozzles 249a and 249b, the nozzles 249a and 249b may be regarded as being included in the inert gas supply part.

The precursor supply system is configured to supply a precursor whose flow rate is controlled from the nozzle 249a to all of the plurality of zones, i.e., the first to third zones. The oxidizing agent supply system is configured to supply an oxidizing agent whose flow rate is controlled from the nozzle 249b to all of the plurality of zones, i.e., the first to third zones. The nitriding agent supply system is configured to supply a nitriding agent whose flow rate is controlled from the nozzle 249b to all of the plurality of zones, i.e., the first to third zones. The inert gas supply system is configured to supply an inert gas whose flow rate is individually controlled from each of the nozzles 249c to 249e to each of the plurality of zones, i.e., the first to third zones.

Furthermore, the inert gas supply part is configured to supply an inert gas whose flow rate is individually controlled from the nozzle 249c to the first zone, not to supply an inert gas controlled in flow rate to the other zones (second and third zones), to supply an inert gas whose flow rate is individually controlled from the nozzle 249d to the second zone, not to supply an inert gas controlled in flow rate to the other zones (first and third zones), to supply an inert gas whose flow rate is individually controlled from the nozzle 249e to the third zone, and not to supply an inert gas whose flow rate is controlled to the other zones (first and second zones).

One or all of various supply systems described above may be configured as an integrated supply system 248 in which the valves 243a to 243h, the MFCs 241a to 241h, and the like are integrated. The integrated supply system 248 is connected to each of the gas supply pipes 232a to 232h so that a supply operation of various kinds of gases into the gas supply pipes 232a to 232h, i.e., an opening/closing operation of the valves 243a to 243h, a flow rate adjusting operation by the MFCs 241a to 241h or the like, is controlled by a controller 121 which will be described later. The integrated supply system 248 is configured as an integral type or division type integrated unit, and is also configured so that it is detachable from the gas supply pipes 232a to 232h or the like, so as to perform maintenance, replacement, expansion or the like of the integrated supply system 248, on an integrated unit basis.

An exhaust port (exhaust slit) 204c configured as, for example, a slit-like through hole is vertically elongated on a side surface of the inner tube 204. The exhaust port 204c has, for example, a rectangular shape in front view, and is installed between the lower portion and the upper portion of the sidewall of the inner tube 204. The inside of the process chamber 201 and an exhaust space 205 with an annular space between the inner tube 204 and the outer tube 203 are configured to communicate with each other via the exhaust port 204c. The exhaust port 204c is disposed on an extension of the straight line L1 described above in a plane view. That is, the nozzle accommodating chamber 204a and the exhaust port 204c are configured to face each other with the centers of the wafers 200 accommodated in the process chamber 201 interposed therebetween. Furthermore, the gas injection holes 250a of the nozzle 249a and the exhaust port 204c are configured to face each other with the centers of the wafers 200 accommodated in the process chamber 201 interposed therebetween.

As illustrated in FIG. 1, an exhaust pipe 231 configured to exhaust an internal atmosphere of the process chamber 201 is connected to a lower portion of the outer tube 203 via the exhaust space 205. A vacuum pump 246 as a vacuum exhaust device is connected to the exhaust pipe 231 via a pressure sensor 245 as a pressure detector (pressure detection part) which detects the internal pressure of the exhaust space 205, i.e., the internal pressure of the process chamber 201, and an auto pressure controller (APC) valve 244 as a pressure regulator (pressure regulation part). The APC valve 244 is configured so that a vacuum exhaust of the interior of the process chamber 201 and a vacuum exhaust stop can be performed by opening and closing the APC valve 244 while operating the vacuum pump 246 and so that the internal pressure of the process chamber 201 can be adjusted by adjusting an opening degree of the APC valve 244 based on pressure information detected by the pressure sensor 245 while operating the vacuum pump 246. An exhaust system is mainly constituted by the exhaust pipe 231, the APC valve 244 and the pressure sensor 245. The exhaust port 204c, and the exhaust space 205 and the vacuum pump 246 may be regarded as being included in the exhaust system.

A lower end opening of the manifold 209 is hermetically sealed by the seal cap 219 through the O-ring 220b. The seal cap 219 is made of a metal material such as SUS or the like, and is formed in a disc shape. A rotation mechanism 267 configured to rotate the boat 217 is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by the boat elevator 115 which is an elevator mechanism vertically installed outside the reaction tube 210. The boat elevator 115 is configured as a transfer device (transfer mechanism) which loads and unloads (transfers) the wafers 200 supported by the boat 217 into and from (out of) the process chamber 201 by moving the seal cap 219 up and down.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed between the outer tuber 203 and the inner tube 204. Based on temperature information detected by the temperature sensor 263, a state of supplying electric power to the heater 207 is adjusted such that the interior of the process chamber 201 has a desired temperature distribution. The temperature sensor 263 is installed along the inner wall of the outer tube 203.

Figure 3:
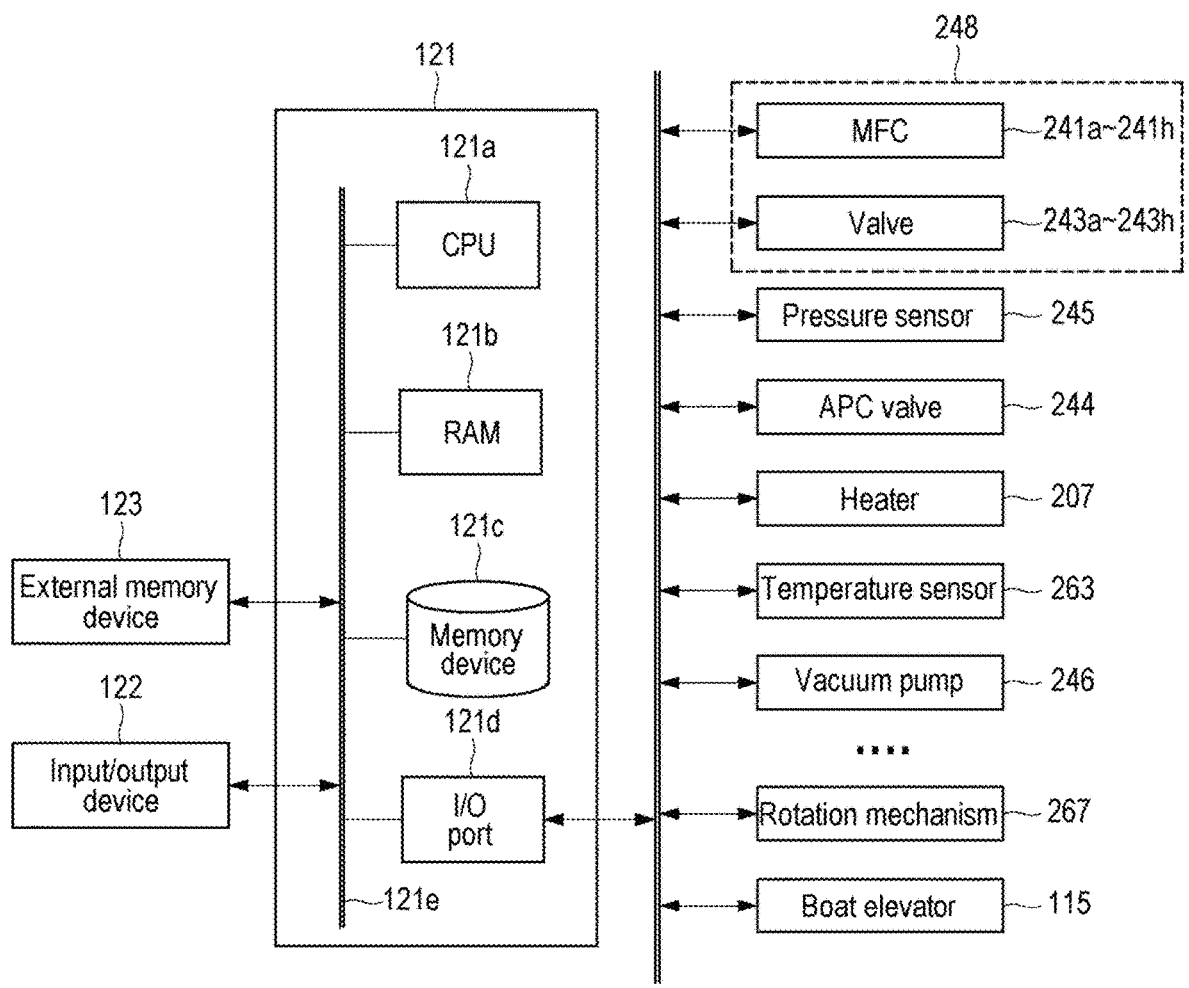
FIG. 3 is a schematic configuration diagram of a controller of the substrate processing apparatus suitably used in one embodiment of the present disclosure, in which a control system of the controller is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 constituted by, e.g., a touch panel or the like, is connected to the controller 121.

The memory device 121c is constituted by, for example, a flash memory, a hard disk drive (HDD), or the like. A control program for controlling operations of a substrate processing apparatus, a process recipe for specifying sequences and conditions of substrate processing as described hereinbelow, or the like is readably stored in the memory device 121c. The process recipe functions as a program for causing the controller 121 to execute each sequence in the substrate processing, as described hereinbelow, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data and the like read by the CPU 121a is temporarily stored.

The I/O port 121d is connected to the MFCs 241a to 241h, the valves 243a to 243h, the pressure sensor 245, the APC valve 244, the vacuum pump 246, the heater 207, the temperature sensor 263, the rotation mechanism 267, the boat elevator 115, and the like, as described above.

The CPU 121a is configured to read the control program from the memory device 121c and execute the same. The CPU 121a also reads the recipe from the memory device 121c according to an input of an operation command from the input/output device 122 or the like. In addition, the CPU 121a is configured to control, according to the contents of the recipe thus read, the flow rate adjusting operation of various kinds of gases by the MFCs 241a to 241h, the opening/closing operation of the valves 243a to 243h, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, and the like.

The controller 121 may be configured by installing, on the computer, the aforementioned program stored in an external memory device 123. The external memory device 123 may include, for example, a magnetic disc such as an HDD, an optical disc such as a CD, a magneto-optical disc such as an MO, a semiconductor memory such as a USB memory, and the like. The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate Processing

A substrate processing sequence example of forming an oxynitride film on a wafer 200 as a substrate using the aforementioned substrate processing apparatus, i.e., a film-forming sequence example, which is one of the processes for manufacturing a semiconductor device, will be described with reference to FIGS. 4 and 5. In the following descriptions, the operations of the respective parts constituting the substrate processing apparatus are controlled by the controller 121.

Figure 4:
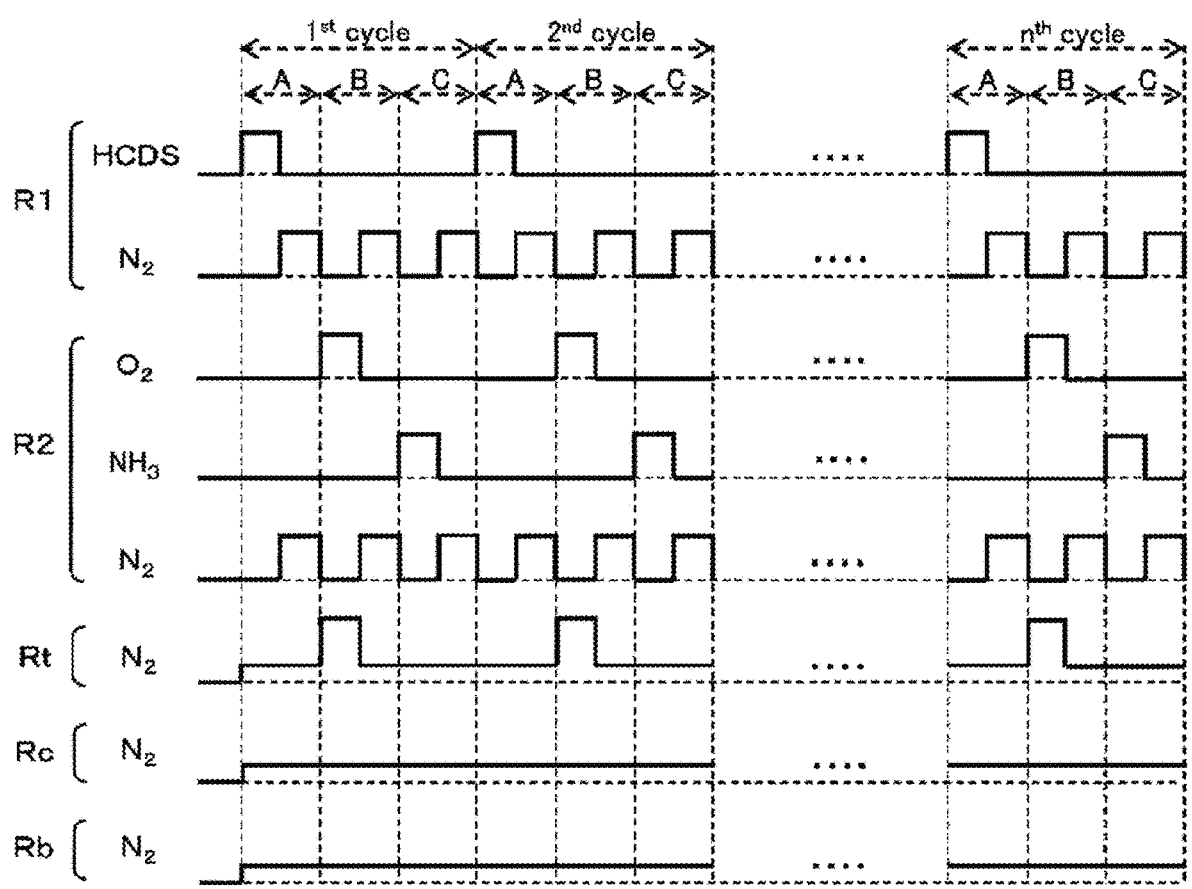
FIG. 4 is a diagram illustrating an example of a film-forming sequence according to an embodiment of the present disclosure.
Figure 5:
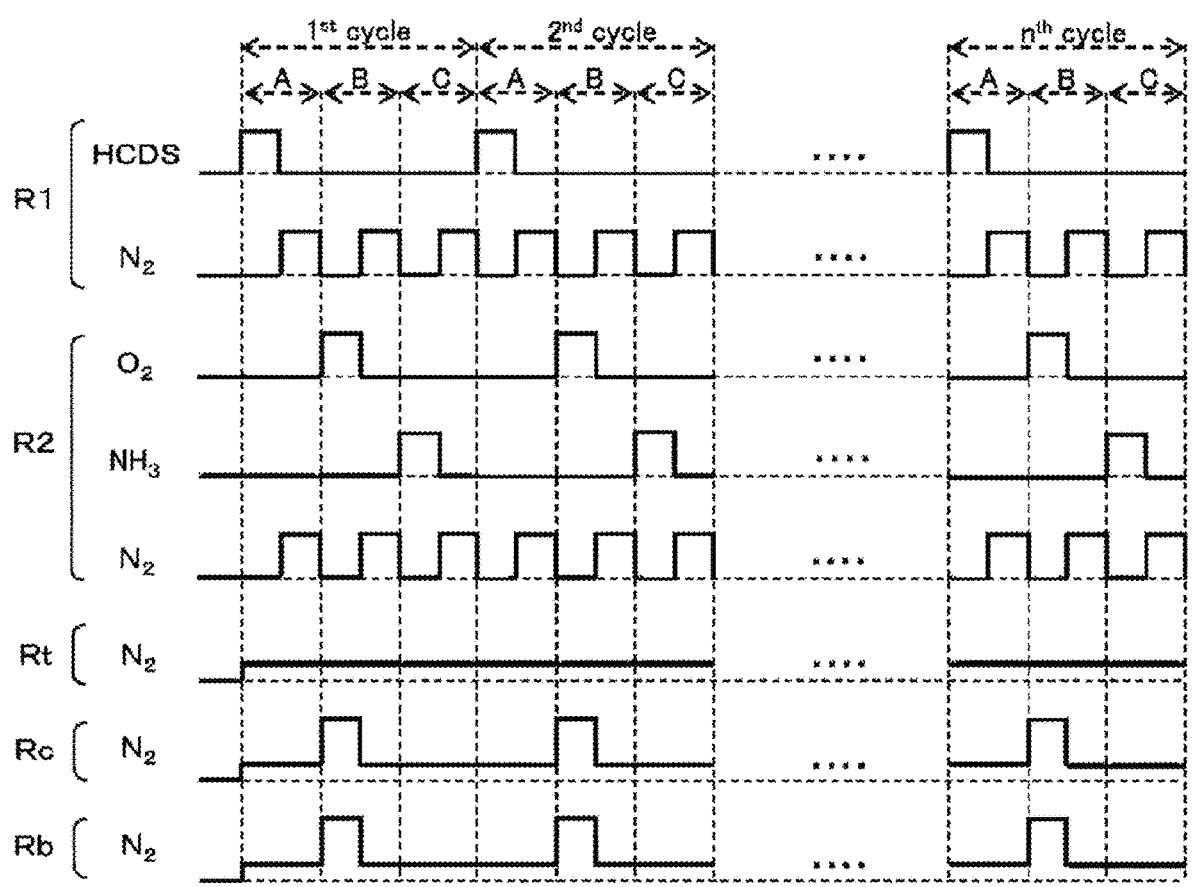
FIG. 5 is a diagram illustrating another example of a film-forming sequence according to an embodiment of the present disclosure.

In the film-forming sequences illustrated in FIGS. 4 and 5, a film containing Si, O and N, i.e., a silicon oxynitride film (SiON film), as an oxynitride film, is formed on a wafer 200 by implementing, a predetermined number of times (n times, where n is an integer of 1 or more), a cycle which non-simultaneously performs: a step A of supplying an HCDS gas as a precursor from the nozzle 249a as the precursor supply part to the wafer 200; a step B of supplying an $O_2$ gas as an oxidizing agent from the nozzle 249b as the oxidizing agent supply part to the wafer 200; and a step C of supplying an $NH_3$ gas as a nitriding agent from the nozzle 249b as the nitriding agent supply part to the wafer 200.

Furthermore, at step B of the film-forming sequences illustrated in FIGS. 4 and 5, at least one of N concentration and refractive index of the SiON film formed on the wafer 200 is adjusted by supplying an $N_2$ gas as an inert gas from the inert gas supply part different from the oxidizing agent supply part, i.e., the nozzles 249c to 249e different from the nozzles 249b, to the wafer 200, and controlling the flow rate of the $N_2$ gas.

In the present disclosure, for the sake of convenience, the film-forming sequences illustrated in FIG. 4 and FIG. 5 may sometimes be denoted as follows. In FIGS. 4 and 5, implementation periods of steps A to C will be respectively referred to as A to C for the sake of convenience. The same denotation will be used in the modifications and other embodiments as described hereinbelow.

$$(R1: HCDS \to R2: O_2, Rt \text{ to } Rb: N_2 \to R2: NH_3) \times n \Rightarrow SiON$$

When the term "wafer" is used herein, it may refer to a wafer itself or a laminated body of a wafer and a predetermined layer or film formed on the surface of the wafer. In addition, when the phrase "a surface of a wafer" is used herein, it may refer to a surface of a wafer itself or a surface of a predetermined layer or the like formed on a wafer. Furthermore, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

(Wafer Charging and Boat Loading)

A plurality of wafers 200 is charged on the boat 217 (wafer charging). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation and Temperature Adjustment)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. Furthermore, the wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The exhaust of the interior of the process chamber 201 and the heating and rotation of the wafers 200 may be all continuously performed at least until the processing of the wafers 200 is completed.

(Film-Forming Step)

Next, the following steps A to C are sequentially performed in a state in which the plurality of wafer 200 are arranged in the wafer arrangement region.

[Step A]

At this step, an HCDS gas is supplied to the wafer 200 in the process chamber 201 (HCDS gas supply step).

Specifically, the valve 243a is opened to allow an HCDS gas to flow through the gas supply pipe 232a. The flow rate of the HCDS gas is adjusted by the MFC 241a. The HCDS gas is supplied from each of the plurality of gas injection holes 250a formed on the side surface of the nozzle 249a into the process chamber 201 and is exhausted from the exhaust pipe 231 via the exhaust port 204c and the exhaust space 205. At this time, the HCDS gas is supplied to the wafer 200.

Simultaneously, the valves 243c to 243e are opened to supply an $N_2$ gas from the nozzles 249c to 249e into the process chamber 201. Also, at this time, the thickness or the like of a SiON film formed on the wafer 200 may be adjusted by individually adjusting the flow rate of the $N_2$ gas supplied from the nozzles 249c to 249e. For example, the flow rate of the $N_2$ gas supplied to one of the first to third zones may be set different from the flow rate of the $N_2$ gas supplied to the other zones. Specific contents of the flow rate adjustment and operational effects thereof will be described later.

Furthermore, at the HCDS gas supply step, the valves 243g and 243h may be opened to supply the $N_2$ gas from the nozzles 249a and 249b into the process chamber 201. In addition, the HCDS gas may be suppressed from entering into the nozzles 249b to 249e by supplying the $N_2$ gas from the nozzles 249b to 249e.

The processing conditions at this step may be exemplified as follows:

HCDS gas supply flow rate: 0.01 to 2 slm, or 0.1 to 1 slm in some embodiments $N_2$ gas supply flow rate (per each of Rt, Rc, and Rb): 0.1 to 10 slm $N_2$ gas supply flow rate (per each of R1 and R2): 0 to 10 slm Supply time of each gas: 1 to 120 seconds, or 1 to 60 seconds in some embodiments Processing temperature: 250 to 800 degrees C., or 400 to 700 degrees C. in some embodiments Processing pressure: 1 to 2,666 Pa, or 67 to 1,333 Pa in some embodiments.

In the present disclosure, the expression of the numerical range such as "250 to 800 degrees C." may mean that a lower limit value and an upper limit value are included in that range. Therefore, "250 to 800 degrees C." may mean, for example, "250 degrees C. or higher and 800 degrees C. or lower". The same applies to other numerical ranges.

By supplying the HCDS gas to the wafer 200 under the aforementioned conditions, a Si-containing layer containing Cl is formed as a first layer on the outermost surface of the wafer 200. The Si-containing layer containing Cl is formed on the outermost surface of the wafer 200 by deposition of Si resulting from physisorption of HCDS, chemisorption of a substance (hereinafter, referred to as $Si_xCl_y$) in which HCDS is partially decomposed, or pyrolysis of HCDS. The Si-containing layer containing Cl may be an adsorption layer (a physisorption layer or a chemisorption layer) of HCDS or $Si_xCl_y$, or may be a Si layer (a deposition layer of Si) containing Cl. In the present disclosure, the Si-containing layer containing Cl will be simply referred to as a Si-containing layer.

After the first layer is formed, the valve 243a is closed to stop the supply of the HCDS gas into the process chamber 201. Then, the interior of the process chamber 201 is vacuum-exhausted and the gas or the like remaining within the process chamber 201 is removed from the interior of the process chamber 201 (purge step). At this time, the valves 243c to 243e, 243g, and 243h are opened to supply the $N_2$ gas from the nozzles 249a to 249e into the process chamber 201. The $N_2$ gas acts as a purge gas.

As the precursor (precursor gas), it may be possible to use, in addition to the HCDS gas, a chlorosilane-based gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, an octachlorotrisilane ($Si_3Cl_8$, abbreviation: OCTS) gas or the like.

As the inert gas, it may be possible to use, in addition to the $N_2$ gas, a rare gas such as an Ar gas, an He gas, an Ne gas, a Xe gas or the like. This also applies to each step as described hereinbelow.

[Step B]

After step A is completed, an $O_2$ gas is supplied to the wafer 200 in the process chamber 201, namely the first layer formed on the wafer 200 ($O_2$ gas supply step).

Specifically, the valve 243b is opened to allow an $O_2$ gas to flow through the gas supply pipe 232b. The flow rate of the $O_2$ gas is adjusted by the MFC 241b. The $O_2$ gas is supplied from each of the plurality of gas injection holes 250b installed on the side surface of the nozzle 249b into the process chamber 201 and is exhausted from the exhaust port 231 via the exhaust port 204c and the exhaust space 205. At this time, the $O_2$ gas is supplied to the wafer 200.

At this time, as at step A, an $N_2$ gas is supplied from the nozzles 249c to 249e into the process chamber 201. Then, at least one of N concentration and refractive index of the SiON film formed on the wafer 200 may be adjusted by individually adjusting the flow rate of the $N_2$ gas supplied from the nozzles 249c to 249e. For example, the flow rate of the $N_2$ gas supplied to one of the first to third zones may be set different from the flow rate of the $N_2$ gas supplied to the other zones. Specific contents of the flow rate adjustment and operational effects thereof will be described later.

Furthermore, at the $O_2$ gas supply step, the $N_2$ gas may be supplied from the nozzles 249a and 249b into the process chamber 201 as at step A. In addition, the $O_2$ gas may be suppressed from entering into the nozzles 249a, and 249c to 249e by supplying the $N_2$ gas from the nozzles 249a, and 249c to 249e.

The processing conditions at this step may be exemplified as follows:
$O_2$ gas supply flow rate: 0.1 to 10 slm
$N_2$ gas supply flow rate (per each of Rt, Rc, and Rb): 0.1 to 10 slm
$N_2$ gas supply flow rate (per each of R1 and R2): 0 to 10 slm
Supply time of each gas: 1 to 120 seconds, or 1 to 60 seconds in some embodiments
Processing pressure: 1 to 4,000 Pa, or 1 to 3,000 Pa in some embodiments.

Other processing conditions may be similar to the processing conditions of step A.

By supplying the $O_2$ gas to the wafer 200 under the aforementioned conditions, at least a portion of the first layer formed on the wafer 200 is oxidized (modified). By modifying the first layer, a layer containing Si and O as a second layer, i.e., a SiO layer, is formed on the wafer 200. When forming the second layer, an impurity such as Cl or the like contained in the first layer constitutes a gaseous substance containing at least Cl during a modification reaction of the first layer by the $O_2$ gas, and is discharged from the interior of the process chamber 201. Thus, the second layer becomes a layer having less impurities such as Cl or the like than those of the first layer.

After the second layer is formed, the valve 243b is closed to stop the supply of the $O_2$ gas into the process chamber 201. Then, the gas or the like remaining within the process chamber 201 is removed from the interior of the process chamber 201 according to the same processing procedures as those of the purge step of step A (purge step).

As the oxidizing agent (oxidizing gas), it may be possible to use, in addition to the $O_2$ gas, an O-containing gas such as a nitrous oxide ($N_2O$) gas, a nitrogen monoxide (NO) gas, a nitrogen dioxide ($NO_2$) gas, an ozone ($O_3$) gas, water vapor ($H_2O$ gas), a carbon monoxide (CO) gas, a carbon dioxide ($CO_2$) gas, or the like.

[Step C]

After step B is completed, an $NH_3$ gas is supplied to the wafer 200 in the process chamber 201, i.e., the second layer formed on the wafer 200 ($NH_3$ gas supply step).

Specifically, the valve 243f is opened to allow an $NH_3$ gas to flow through the gas supply pipe 232f. The flow rate of the $NH_3$ gas is adjusted by the MFC 241f. The $NH_3$ gas is allowed to flow through the nozzle 249b via the gas supply pipe 232b, is supplied from each of the plurality of gas injection holes 250b formed on the side surface of the nozzle 249b into the process chamber 201, and is exhausted from the exhaust pipe 231 via the exhaust port 204c and the exhaust space 205. At this time, the $NH_3$ gas is supplied to the wafer 200.

Simultaneously, as at step A, an $N_2$ gas is supplied from the nozzles 249c to 249e into the process chamber 201. Also, at this time, the thickness or the like of the SiON film formed on the wafer 200 may be adjusted by individually adjusting the flow rate of the $N_2$ gas supplied from the nozzles 249c to 249e. For example, the flow rate of the $N_2$ gas supplied to one of the first to third zones may be set different from the flow rate of the $N_2$ gas supplied to the other zones. Specific contents of the flow rate adjustment and operational effects thereof will be described later.

Furthermore, at the $NH_3$ gas supply step, the $N_2$ gas may be supplied from the nozzles 249a and 249b into the process chamber 201 as at step A. In addition, the $NH_3$ gas may be suppressed from entering into the nozzles 249a and 249c to 249e can be suppressed by supplying the N₂ gas from the nozzles 249a and 249c to 249e.

The processing conditions at this step may be exemplified as follows:

NH₃ gas supply flow rate: 0.1 to 10 slm
N₂ gas supply flow rate (per each of Rt, Rc, and Rb): 0.1 to 10 slm
N₂ gas supply flow rate (per each of R1 and R2): 0 to 10 slm
Supply time of each gas: 1 to 120 seconds, or 1 to 60 seconds in some embodiments
Processing pressure: 1 to 4,000 Pa, or 1 to 3,000 Pa in some embodiments.

Other processing conditions may be similar to the processing conditions of step A.

By supplying the NH₃ gas to the wafer 200 under the aforementioned conditions, at least a portion of the second layer formed on the wafer 200 is nitrided (modified). By modifying the second layer, a layer containing Si, O and N as a third layer, i.e., a SiON layer, is formed on the wafer 200. When forming the third layer, an impurity such as Cl or the like contained in the second layer constitutes a gaseous substance containing at least Cl during a modification reaction of the second layer by the NH₃ gas, and is discharged from the interior of the process chamber 201. Thus, the third layer becomes a layer having less impurities such as Cl or the like than those of the second layer.

After the third layer is formed, the valve 243f is closed to stop the supply of the NH₃ gas into the process chamber 201. Then, the gas or the like remaining within the process chamber 201 is removed from the interior of the process chamber 201 according to the same processing procedures as those of the purge step of step A (purge step).

As the nitriding agent (nitriding gas), it may be possible to use, in addition to the NH₃ gas, an N-containing gas such as a diazene (N₂H₂) gas, a hydrazine (N₂H₄) gas, an N₃H₈ gas, or the like.

[Performing a Predetermined Number of Times]

A cycle which non-simultaneously, i.e., non-synchronously, performs steps A to C is implemented once or more (n times, where n is an integer of 1 or more), whereby a SiON film having a desired thickness and a desired composition can be formed on the wafer 200. The aforementioned cycle may be repeated multiple times. That is, the thickness of the third layer formed per one cycle may be set smaller than the desired thickness, and the aforementioned cycle may be repeated multiple times until the thickness of the SiON film formed by laminating the third layer becomes equal to the desired thickness.

(After-Purge to Atmospheric Pressure Return)

After the film-forming step is completed, the N₂ gas is supplied from the nozzles 249a to 249e into the process chamber 201 and is exhausted from the exhaust pipe 231 via the exhaust port 204c and the exhaust space 205. The N₂ gas acts as a purge gas. Thus, the interior of the process chamber 201 is purged and the gas or the reaction byproduct, which remains within the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading and Wafer Discharging)

Thereafter, the seal cap 219 is moved down by the boat elevator 115 to open the lower end of the manifold 209. Then, the processed wafers 200 supported on the boat 217 are unloaded from the lower end of the manifold 209 to the outside of the reaction tube 210 (boat unloading). After being unloaded to the outside of the reaction tube 210, the processed wafers 200 are discharged from the boat 217 (wafer discharging).

(3) Flow Rate Control of N₂ gas and Operational Effects

Next, specific contents of the flow rate control of the N₂ gas performed at steps A to C and operational effects thereof will be described.

(a) By supplying the N₂ gas from the nozzles 249c to 249e (Rt to Rb) different from the nozzle 249b (R2) for supplying the O₂ gas to the wafer 200 and controlling the flow rate of the N₂ gas at step B, i.e., by supplying the N₂ gas whose flow rate is individually controlled to each of the first to third zones in the wafer arrangement region, it is possible to adjust at least one of N concentration and refractive index of the SiON film formed on the wafer 200.

Specifically, the flow rate of the N₂ gas supplied to one of the first to third zones is set to be different from the flow rate of the N₂ gas supplied to the other zones. Thus, it is possible to adjust at least one of N concentration and refractive index of the SiON film formed on the wafer 200 for each of the first to third zones.

For example, as illustrated in FIG. 4, at step B, the flow rate of the N₂ gas supplied from Rt to the first zone is set larger than the flow rate of the N₂ gas supplied from each of Rc and Rb to each of the second and third zones while supplying the N₂ gas whose flow rate is controlled from each of Rt to Rb to each of the first to third zones. This makes it possible to locally control at least one of the N concentration and the refractive index of the SiON film formed on the wafer 200 in the first zone, for example, so as to be equal to or higher than those of the SiON film formed on the wafer 200 in the other zones (second and third zones).

Furthermore, for example, as illustrated in FIG. 5, at step B, the flow rate of the N₂ gas supplied from Rt to the first zone is set smaller than the flow rate of the N₂ gas supplied from each of Rc and Rb to each of the second and third zones while supplying the N₂ gas whose flow rate is controlled from each of Rt to Rb to each of the first to third zones. This makes it possible to locally control at least one of the N concentration and the refractive index of the SiON film formed on the wafer 200 in the first zone, for example, in a direction that makes them equal to or lower than those of the SiON film formed on the wafer 200 in the other zones (second and third zones).

(b) According to the present embodiment, it is possible to perform the aforementioned adjustment without significantly changing the thickness of the SiON film formed on the wafer 200, i.e., to adjust at least one of the N concentration and the refractive index.

On the other hand, in order to increase the N concentration of the SiON film formed on the wafer 200 in the first zone, if the flow rate of the NH₃ gas supplied to the first zone is increased at step C, the thickness of the SiON film formed on the wafer 200 in the first zone may be greatly increased compared with the thickness of the SiON film formed on the wafer 200 in the first zone by performing the film-forming sequence illustrated in FIG. 4.

Furthermore, in order to reduce the N concentration of the SiON film formed on the wafer 200 in the first zone, if the flow rate of the NH₃ gas supplied to the first zone is reduced at step C, the thickness of the SiON film formed on the wafer 200 may be greatly reduced compared with the thickness of the SiON film formed on the wafer 200 in the first zone by performing the film-forming sequence illustrated in FIG. 5.

(c) By supplying the N₂ gas from the nozzles 249c to 249e (Rt to Rb), which are different from the nozzle 249a (R1) for supplying the HCDS gas and the nozzle 249b (R2) for supplying the NH₃ gas, to the wafer 200 and controlling the flow rate of the N₂ gas in at least one of step A and step C, it is possible to adjust the thickness of the SiON film formed on the wafer 200.

Specifically, the flow rate of the N₂ gas supplied to one of the first to third zones is set different from the flow rate of the N₂ gas supplied to the other zones. This makes it possible to adjust the thickness of the SiON film formed on the wafer 200 for each of the first to third zones, i.e., for each of the plurality of zones. That is, it is possible to adjust an inter-wafer film thickness distribution of the SiON film formed on the wafer 200.

For example, in at least one of step A and step C, the flow rate of the N₂ gas supplied from Rt to the first zone is set larger than the flow rate of the N₂ gas supplied from each of Rc and Rb to each of the second and third zones while supplying the N₂ gas whose flow rate is controlled from each of Rt to Rb to each of the first to third zones. This makes it possible to control locally the thickness of the SiON film formed on the wafer 200 in the first zone, for example, so as to be smaller than that of the SiON film formed on the wafer 200 in the other zones (second and third zones).

Furthermore, for example, in at least one of step A and step C, the flow rate of the N₂ gas supplied from Rt to the first zone is set smaller than the flow rate of the N₂ gas supplied from each of Rc and Rb to each of the second and third zones while supplying the N₂ gas whose flow rate is controlled from each of Rt to Rb to each of the first to third zones. This makes it possible to locally control the thickness of the SiON film formed on the wafer 200 in the first zone, for example, so as to be larger than the thickness of the SiON film formed on the wafer 200 in the other zones (second and third zones).

In addition, by performing the supply control (flow rate control) of the N₂ gas from Rt to Rb at step A, it is possible not only to adjust the inter-wafer film thickness distribution of the SiON film formed on the wafer 200 but also to locally and finely adjust the refractive index and the N concentration of the SiON film formed on the wafer 200.

Moreover, by performing the supply control (flow rate control) of the N₂ gas from Rt to Rb at step C, it is possible to adjust the inter-wafer film thickness distribution of this film without locally changing the refractive index and the N concentration of the SiON film formed on the wafer 200.

(d) By supplying the N₂ gas from at least one of the nozzles 249a and 249b (R1 and R2) to the wafer 200 and controlling the flow rate of the N₂ gas in at least one of step A and step C, it is possible to adjust an inter-wafer average film thickness (batch average film thickness) of the SiON film formed on the wafer 200.

For example, by increasing the flow rate of the N₂ gas supplied from at least one of R1 and R2 to the entire first to third zones at step A, it is possible to control the batch average film thickness of the SiON film formed on the wafer 200 so as to be small. In addition, for example, by reducing the flow rate of the N₂ gas supplied from at least one of R1 and R2 to the entire first to third zones at step A, it is possible to control the batch average film thickness of the SiON film formed on the wafer 200 so as to be large.

Furthermore, for example, by increasing the flow rate of the N₂ gas supplied from at least one of R1 and R2 to the entire first to third zones at step C, it is possible to control the batch average film thickness of the SiON film formed on the wafer 200 so as to be small. Moreover, for example, by reducing the flow rate of the N₂ gas supplied from at least one of R1 and R2 to the entire first to third zones at step C, it is possible to control the batch average film thickness of the SiON film formed on the wafer 200 so as to be large.

(e) By supplying the N₂ gas from at least one of the nozzles 249a and 249b (R1 and R2) to the wafer 200 and controlling the flow rate of the N₂ gas at step B, it is possible to adjust at least one of an inter-wafer average N concentration (batch average N concentration) and an inter-wafer average refractive index (batch average refractive index) of the SiON film formed on the wafer 200.

For example, by increasing the flow rate of the N₂ gas supplied from at least one of R1 and R2 to the entire first to third zones at step B, it is possible to control at least one of the batch average N concentration and the batch average refractive index of the SiON film formed on the wafer 200 so as to be large. Furthermore, for example, by reducing the flow rate of the N₂ gas supplied from at least one of R1 and R2 to the entire first to third zones at step B, it is possible to control at least one of the batch average N concentration and the batch average refractive index of the SiON film formed on the wafer 200 so as to be small.

(f) By performing the control of the aforementioned (d) and (e), it is possible to adjust each of the batch average film thickness, the batch average N concentration, the batch average refractive index, and the like of the SiON film formed on the wafer 200 to have a desired value and to find processing conditions for doing so. Furthermore, by performing the control of the aforementioned (c), it is possible to adjust the inter-wafer film thickness distribution of the SiON film formed on the wafer 200 to become a desired distribution, and to find conditions for doing so. First, after finding these processing conditions, by performing the control of the aforementioned (a) based on these processing conditions, as described in (b), it is possible to locally adjust at least one of the N concentration and the refractive index of the SiON film formed on the wafer 200 without significantly changing the thickness of the SiON film formed on the wafer 200.

(g) The effects mentioned above can be similarly achieved in the case where the aforementioned precursor other than the HCDS gas is used, or in the case where the aforementioned oxidizing agent other than the O₂ gas is used, or in the case where the aforementioned nitriding agent other than the NH₃ gas is used, or in the case where the aforementioned inert gas other than the N₂ gas is used.

<Other Embodiments>

While one embodiment of the present disclosure has been specifically described above, the present disclosure is not limited to the aforementioned embodiment but may be variously modified without departing from the spirit of the present disclosure.

For example, a SiON film, a silicon oxycarbide film (SiOC film), a silicon oxycarbonitride film (SiOCN film) or the like may be formed on a substrate using an N-containing gas such as an NH₃ gas, a carbon (C)-containing gas such as a propylene ($C_3H_6$) gas, a gas containing N and C such as a triethylamine (($C_2H_5$)₃N, abbreviation: TEA) gas, or the like as a reactant and by the film-forming sequences denoted below. Even in these cases, the same effects as the aforementioned embodiments may be achieved. The processing procedures and processing conditions for supplying these reactants may be similar to, e.g., those for supplying the reactants in the aforementioned embodiments.

(R1: HCDS→R2: $NH_3$→R2: $O_2$, Rt to Rb: $N_2$)× $n$⇒SiON (R1: HCDS→R2: $O_2$, Rt to Rb: $N_2$→R2: TEA)×
n⇒SiOC (N)

(R1: HCDS→R2: TEA→R2: $O_2$, Rt to Rb: $N_2$)×
n⇒SiOC (N)

(R1: HCDS→R2: $C_3H_6$→R2: $NH_3$→R2: $O_2$, Rt to
Rb: $N_2$)×n⇒SiOCN (R1: HCDS→R2: $C_3H_6$→R2: $O_2$, Rt to Rb: $N_2$→R2:
$NH_3$)×n⇒SiOCN

Furthermore, for example, a titanium oxynitride film (TiON film), an aluminum oxynitride film (AlON film) or the like may be formed on the substrate using a titanium tetrachloride ($TiCl_4$) gas, a trimethylaluminum ($Al(CH_3)_3$, abbreviation: TMA) gas or the like as a precursor and by the film-forming sequences denoted below. Even in these cases, the same effects as the aforementioned embodiments may be achieved. The processing procedures and processing conditions for supplying these precursors or reactants may be similar to, e.g., those for supplying the precursors or reactants in the aforementioned embodiment.

(R1: $TiCl_4$→R2: $O_2$, Rt to Rb: $N_2$→R2: $NH_3$)×
n⇒TiON (R1: $TiCl_4$→R2: $NH_3$→R2: $O_2$, Rt to Rb: $N_2$)×
n⇒TiON (R1: TMA→R2: $H_2O$, Rt to Rb: $N_2$→R2: $NH_3$)×
n⇒AlON (R1: TMA→R2: $NH_3$→R2: $H_2O$, Rt to Rb: $N_2$)×
n⇒AlON

Recipes used in substrate processing may be prepared individually according to the processing contents and may be stored in the memory device 121c via a telecommunication line or the external memory device 123 in some embodiments. Moreover, at the start of substrate processing, the CPU 121a may properly select an appropriate recipe from a plurality of recipes stored in the memory device 121c according to the processing contents in some embodiments. Thus, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which films are formed using a batch-type substrate processing apparatus capable of processing a plurality of substrates at a time. The present disclosure is not limited to the aforementioned embodiment but may be appropriately applied to, e.g., a case where films are formed using a single-wafer-type substrate processing apparatus capable of processing a single substrate or several substrates at a time. In addition, in the aforementioned embodiments, there have been described examples in which films are formed using the substrate processing apparatus provided with a hot-wall-type process furnace. The present disclosure is not limited to the aforementioned embodiments but may be appropriately applied to a case where films are formed using a substrate processing apparatus provided with a cold-wall-type process furnace. In the case of using these substrate processing apparatuses, a film-forming process may be performed by the sequences and processing conditions similar to those of the embodiments and modifications described above, and the same effects as those of the embodiments and modifications described above.

The embodiments described above may be appropriately combined with one another. The processing procedures and processing conditions at this time may be similar to, for example, the processing procedures and processing conditions of the aforementioned embodiments.

EXAMPLES

Next, reference examples and examples will be described.

Reference Examples 1 and 2

A SiON film was formed on a wafer by performing a cycle which sequentially and non-simultaneously supplies an HCDS gas, an $O_2$ gas, and an $NH_3$ gas to the wafer using the substrate processing apparatus illustrated in FIG. 1 a predetermined number of times. At step of supplying an $O_2$ gas, the supply control (flow rate control) of the $N_2$ gas from Rt to Rb described in the aforementioned embodiment was not performed. In reference example 1, the supply flow rate of an $NH_3$ gas to the wafer was set at 2 slm, and in reference example 2, the supply flow rate of an $NH_3$ gas was set at 5 slm. Then, the film thickness and the refractive index of the SiON film formed on the wafer were measured respectively.

FIGS. 7A and 7B are diagrams respectively illustrating measurement results of the thickness and the refractive index of the SiON films in reference examples 1 and 2 in order. The horizontal axis in FIG. 7A indicates a thickness (Å) of the SiON film formed on the wafer, and the horizontal axis in FIG. 7B indicates a refractive index of the SiON film formed on the wafer. In any of the drawings, the vertical axis indicates a position of the wafer in the wafer arrangement region. Furthermore, "120" on the vertical axis indicates an upper side (top), and "0" indicates a lower side (bot). In addition, marks ♦ and ■ indicate reference examples 1 and 2 in order. The meanings of "120" and "0" on the vertical axis described herein are similar to those in FIGS. 8A to 8C, FIGS. 9A to 9C, and FIGS. 10A to 10C, respectively.

According to FIG. 7A, when the supply flow rate of the $NH_3$ gas is increased (reference example 1→2), it can be seen that the thickness of the SiON film formed on the wafer is uniformly increased from the upper portion to the lower portion of the wafer arrangement region. Furthermore, according to FIG. 7B, when the supply flow rate of the $NH_3$ gas is increased, it can be seen that the refractive index of the SiON film formed on the wafer does not change on the upper side of the wafer arrangement region and the refractive index of the SiON film formed on the wafer is reduced on the lower side of the wafer arrangement region. From these results, when the supply control of the $N_2$ gas from Rt to Rb is not performed at step of supplying the $O_2$ gas, it is understood that the thickness of the SiON film formed on the wafer is not significantly changed and that it is difficult to locally adjust the refractive index of that film.

Examples 1 to 3

A SiON film was formed on the wafer according to a film-forming sequence in the aforementioned embodiments using the substrate processing apparatus illustrated in FIG. 1. The supply control of the N₂ gas from Rt to Rb was performed at step B, and was not performed at steps A and C. The supply flow rates of the N₂ gas from Rt, Rc, and Rb at step B were set as follows. Other processing conditions were set to be predetermined conditions which fall within the processing condition range described in the aforementioned embodiments, and were set to common conditions in examples 1 to 3.

Figure 8A:
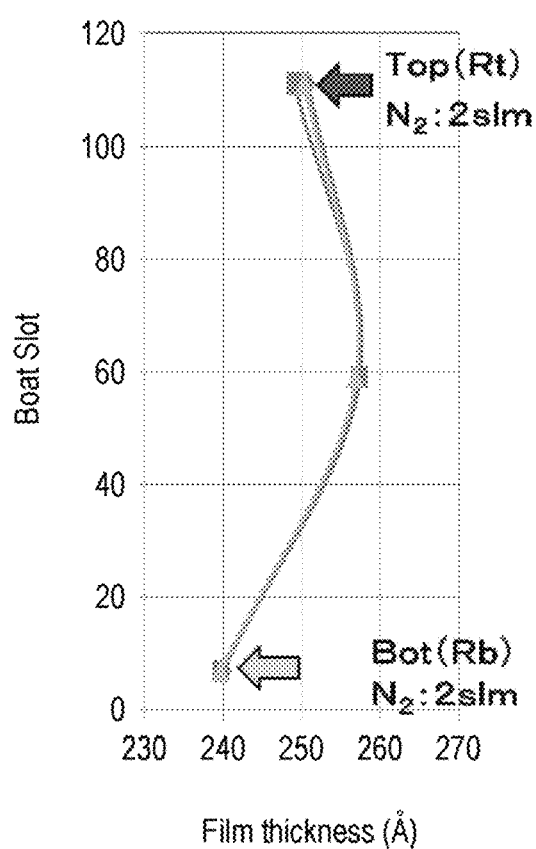
FIG. 8A is a diagram illustrating a measurement result of film thickness of an oxynitride film formed on a substrate.
Figure 8B:
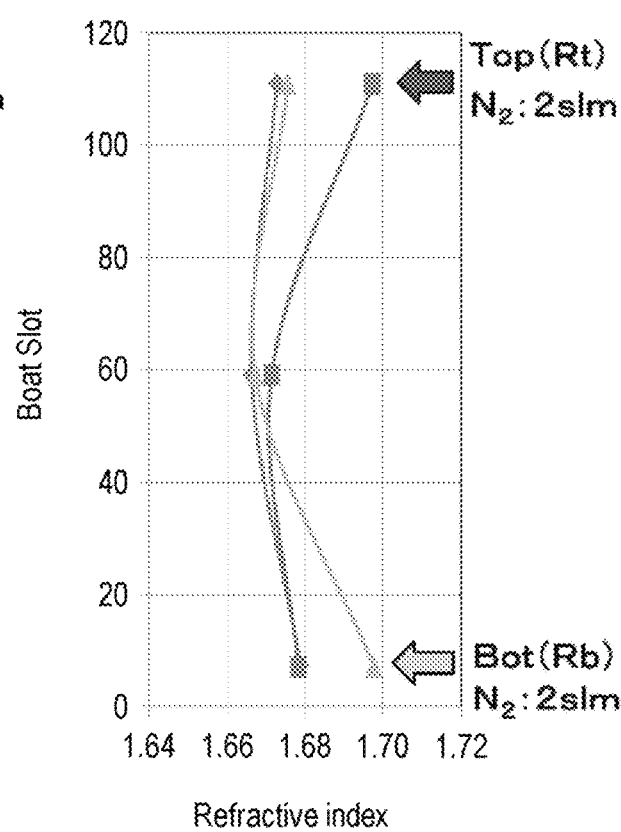
FIG. 8B is a diagram illustrating a measurement result of refractive index of an oxynitride film formed on the substrate.

(Example 1) Rt: 0.2 slm, Rc: 0.2 slm, Rb: 0.2 slm
(Example 2) Rt: 2.0 slm, Rc: 0.2 slm, Rb: 0.2 slm
(Example 3) Rt: 0.2 slm, Rc: 0.2 slm, Rb: 2.0 slm Then, the film thickness, the refractive index, and the N concentration of the SiON film formed on the wafer were each measured. FIGS. 8A to 8C are diagrams respectively illustrating measurement results of the film thickness, the refractive index, and the N concentration of the SiON films in examples 1 to 3 in order. The horizontal axis in FIG. 8A indicates a thickness (A) of the SiON film formed on the wafer, the horizontal axis in FIG. 8B indicates a refractive index of the SiON film formed on the wafer, and the horizontal axis in FIG. 8C indicates an N concentration (at %) of the SiON film formed on the wafer. In any of the drawings, the vertical axis indicates a position of the wafer in the wafer arrangement region. In addition, ♦, ■ and ▲ marks indicate examples 1 to 3 in order.

According to FIG. 8A, even when the flow rate of the N₂ gas supplied from Rt is increased (example 1, 3→2), and even when the flow rate of the N₂ gas supplied from Rb is increased (example 1, 2→3), it can be seen that the thickness of the SiON film formed on the wafer hardly changes from the upper portion to the lower portion of the wafer arrangement region.

According to FIG. 8B, it can be seen that the refractive index of the SiON film formed on the wafer is increased on the upper side of the wafer arrangement region by increasing the flow rate of the N₂ gas supplied from Rt (example 1, 3→2). In addition, it can be seen that the refractive index of the SiON film formed on the wafer is increased on the lower side of the wafer arrangement region by increasing the flow rate of the N₂ gas supplied from Rb (example 1, 2→3).

According to FIG. 8C, it can be seen that the N concentration of the SiON film formed on the wafer is increased on the upper side of the wafer arrangement region by increasing the flow rate of the N₂ gas supplied from Rt (example 1, 3→2). In addition, it is understood that the N concentration of the SiON film formed on the wafer is increased on the lower side of the wafer arrangement region by increasing the flow rate of the N₂ gas supplied from Rb (example 1, 2→3).

From the above, it can be seen that at least one of the N concentration and the refractive index of this film can be adjusted, without significantly changing the thickness of the SiON film formed on the wafer 200, by performing the supply control of the N₂ gas from Rt to Rb at step B.

Examples 4 to 6

A SiON film was formed on the wafer according to the film-forming sequence in the aforementioned embodiment using the substrate processing apparatus illustrated in FIG. 1. The supply control of the N₂ gas from Rt to Rb was performed at step A, and was not performed at steps B and C. The supply flow rates of the N₂ gas from Rt, Rc, and Rb at step A were set as follows. Other processing conditions were set to predetermined conditions which fall within the processing condition range described in the aforementioned embodiments, and were set to common conditions in examples 4 to 6.

(Example 4) Rt: 0.2 slm, Rc: 0.2 slm, Rb: 0.2 slm
(Example 5) Rt: 2.0 slm, Rc: 0.2 slm, Rb: 0.2 slm
(Example 6) Rt: 0.2 slm, Rc: 0.2 slm, Rb: 2.0 slm Then, the film thickness, the refractive index and the N concentration of the SiON film formed on the wafer were measured respectively. FIGS. 9A to 9C are diagrams respectively illustrating measurement results of the film thickness, the refractive index, and the N concentration of the SiON films in examples 4 to 6 in order. The horizontal axis in FIG. 9A indicates a thickness (A) of the SiON film formed on the wafer, the horizontal axis in FIG. 9B indicates a refractive index of the SiON film formed on the wafer, and the horizontal axis in FIG. 9C indicates an N concentration (at %) of the SiON film formed on the wafer. In any of the drawings, the vertical axis indicates a position of the wafer in the wafer arrangement region. In addition, ♦, ■ and ▲ marks indicate examples 4 to 6 in order.

According to FIG. 9A, it can be seen that the thickness of the SiON film formed on the wafer is reduced on the upper side of the wafer arrangement region by increasing the flow rate of the N₂ gas supplied from Rt (example 4, 6→5). Furthermore, it can be seen that the thickness of the SiON film formed on the wafer is reduced on the lower side of the wafer arrangement region by increasing the flow rate of the N₂ gas supplied from Rb (Example 4, 5→6).

According to FIG. 9B, it can be seen that the refractive index of the SiON film formed on the wafer is reduced on the upper side of the wafer arrangement region by increasing the flow rate of the N₂ gas supplied from Rt (Example 4, 6→5). In addition, it can be understood that the refractive index of the SiON film formed on the wafer is reduced on the lower side of the wafer arrangement region by increasing the flow rate of the N₂ gas supplied from Rb (example 4, 5→6). Moreover, it is understood that a degree of reduction of the refractive index is larger in the case of increasing the flow rate of the N₂ gas supplied from Rt than in the case of increasing the flow rate of the N₂ gas supplied from Rb.

According to FIG. 9C, it can be seen that the N concentration of the SiON film formed on the wafer is reduced on the upper side of the wafer arrangement region by increasing the flow rate of the N₂ gas supplied from Rt (example 4, 6→5). In addition, it can be seen that the N concentration of the SiON film formed on the wafer is reduced on the lower side of the wafer arrangement region by increasing the flow rate of the N₂ gas supplied from Rb (examples 4, 5→6). Moreover, it is understood that a degree of reduction of the N concentration is larger in the case of increasing the flow rate of the N₂ gas supplied from Rt than in the case of increasing the flow rate of the N₂ gas supplied from Rb.

From the above, it can be seen that the inter-wafer film thickness distribution of the SiON film formed on the wafer 200 can be adjusted by performing the supply control of the N₂ gas from Rt to Rb at step A. Furthermore, it is understood that the refractive index and the N concentration of the SiON film formed on the wafer 200 can be finely adjusted locally.

Examples 7 to 9

A SiON film was formed on the wafer according to the film-forming sequence in the aforementioned embodiment using the substrate processing apparatus illustrated in FIG. 1. The supply control of the N₂ gas from Rt to Rb was performed at step C, and was not performed at steps A and B. The supply flow rate of the N₂ gas from Rt, Rc, and Rb at step C was set as follows. Other processing conditions were set to predetermined conditions which fall within the processing condition range described in the aforementioned embodiments, and were set to common conditions in examples 7 to 9.

(Example 7) Rt: 0.2 slm, Rc: 0.2 slm, Rb: 0.2 slm
(Example 8) Rt: 2.0 slm, Rc: 0.2 slm, Rb: 0.2 slm
(Example 9) Rt: 0.2 slm, Rc: 0.2 slm, Rb: 2.0 slm Then, the film thickness, the refractive index and the N concentration of the SiON film formed on the wafer were measured respectively. FIGS. 10A to 10C are diagrams respectively illustrating measurement results of the film thickness, the refractive index, and the N concentration of the SiON films in examples 7 to 9 in order. The horizontal axis in FIG. 10A indicates a thickness (Å) of the SiON film formed on the wafer, the horizontal axis in FIG. 10B indicates a refractive index of the SiON film formed on the wafer, and the horizontal axis in FIG. 10C indicates an N concentration (at %) of the SiON film formed on the wafer. In any of the drawings, the vertical axis indicates a position of the wafer in the wafer arrangement region. In addition, ♦, ■ and ▲ marks indicate examples 7 to 9 in order.

According to FIG. 10A, it can be seen that the thickness of the SiON film formed on the wafer is reduced on the upper side of the wafer arrangement region by increasing the flow rate of the $N_2$ gas supplied from Rt (example 7, 9→8). Furthermore, it can be seen that the film thickness of the SiON film formed on the wafer is reduced on the lower side of the wafer arrangement region by increasing the flow rate of the $N_2$ gas supplied from Rb (example 7, 8→9).

According to FIG. 10B, it can be seen that the refractive index of the SiON film formed on the wafer is slightly increased on the upper side of the wafer arrangement region by increasing the flow rate of the $N_2$ gas supplied from Rt (example 7, 9→8). In addition, it can be seen that the refractive index of the SiON film formed on the wafer is slightly increased on the lower side of the wafer arrangement region by increasing the flow rate of the $N_2$ gas supplied from Rb (example 7, 8→9).

According to FIG. 10C, it can be seen that the N concentration of the SiON film formed on the wafer is slightly reduced on the upper side of the wafer arrangement region by increasing the flow rate of the $N_2$ gas supplied from Rt (example 7, 9→8). Furthermore, it can be seen that the N concentration of the SiON film formed on the wafer is slightly reduced on the lower side of the wafer arrangement region by increasing the flow rate of the $N_2$ gas supplied from Rb (example 7, 8→9).

From the above, it is understood that it is possible to adjust the inter-wafer film thickness distribution of the SiON film formed on the wafer 200 by performing the supply control of the $N_2$ gas from Rt to Rb at step C. Moreover, it is understood that the refractive index and the N concentration of the SiON film formed on the wafer 200 can be finely adjusted locally.

According to the present disclosure in some embodiments, it is possible to control at least one of nitrogen concentration and refractive index of an oxynitride film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   forming an oxynitride film on each of a plurality of substrates by performing a cycle a predetermined number of times, the cycle including non-simultaneously performing:
   (a) supplying a precursor from a precursor supply part to the plurality of substrates;
   (b) supplying an oxidizing agent from an oxidizing agent supply part to the plurality of substrates; and
   (c) supplying a nitriding agent from a nitriding agent supply part to the plurality of substrates,
   wherein in (b), inert gas is supplied from a plurality of inert gas supply parts, which is different from the oxidizing agent supply part, to the plurality of substrates, and at least one of nitrogen concentration and refractive index of the oxynitride film formed on each of the plurality of substrates is adjusted by controlling a flow rate of the inert gas,
   wherein the act of forming the oxynitride film is performed in a state in which the plurality of substrates is arranged in a substrate arrangement region that is divided into a plurality of zones in a vertical direction, and
   wherein in (b), the inert gas is supplied from the plurality of inert gas supply parts to the plurality of zones, respectively, and flow rates of the inert gas supplied from the plurality of inert gas supply parts are controlled individually.

2. The method according to claim 1, the plurality of inert gas supply parts is installed to correspond to the plurality of zones, respectively.

3. The method according to claim 2, wherein in (b), the inert gas whose flow rate is controlled is not supplied from each of the plurality of inert gas supply parts to non-corresponding zones, among the plurality of zones, to which the each of the plurality of inert gas supply parts does not correspond.

4. The method according to claim 1, wherein the plurality of zones include at least a first zone on one end side of the substrate arrangement region, a second zone on a central side of the substrate arrangement region, and a third zone on the other end side of the substrate arrangement region, and
   wherein in (b), the inert gas whose flow rate is individually controlled is supplied from the plurality of inert gas supply parts to at least the first zone, the second zone, and the third zone, respectively.

5. The method according to claim 4, wherein the plurality of inert gas supply parts includes a first supply part, a second supply part, and a third supply part, and the first supply part, the second supply part, and the third supply part are installed to correspond to the first zone, the second zone, and the third zone, respectively, and
   wherein in (b), the inert gas whose flow rate is individually controlled is supplied from the first supply part, the second supply part, and the third supply part to the first zone, the second zone, and the third zone, respectively.

6. The method according to claim 5, wherein in (b), the inert gas whose flow rate is individually controlled is supplied from the first supply part to the first zone, and is not supplied to the second zone and the third zone, wherein the inert gas whose flow rate is individually controlled is supplied from the second supply part to the second zone, and is not supplied to the first zone and the third zone, and wherein the inert gas whose flow rate is individually controlled is supplied from the third supply part to the third zone, and is not supplied to the first zone and the second zone.

7. The method according to claim 1, wherein in (b), at least one of the nitrogen concentration and the refractive index of the oxynitride film formed on each of the plurality of substrates is adjusted for each of the plurality of zones by controlling the flow rate of the inert gas supplied to each of the plurality of zones.

8. The method according to claim 7, wherein in (b), the flow rate of the inert gas supplied to one of the plurality of zones is set different from the flow rate of the inert gas supplied to the other zones.

9. The method according to claim 7, wherein in (b), the flow rate of the inert gas supplied to one of the plurality of zones is controlled to be larger than the flow rate of the inert gas supplied to the other zones so as to increase at least one of the nitrogen concentration and the refractive index of the oxynitride film formed on each of substrates, among the plurality of substrates, in the one of the plurality of zones.

10. The method according to claim 7, wherein in (b), the flow rate of the inert gas supplied to one of the plurality of zones is controlled to be smaller than the flow rate of the inert gas supplied to the other zones so as to decrease at least one of the nitrogen concentration and the refractive index of the oxynitride film formed on each of substrates, among the plurality of substrates, in the one of the plurality of zones.

11. The method according to claim 1, wherein in at least one of (a) and (c), the inert gas is supplied from the plurality of inert gas supply parts to the plurality of substrates, and wherein a thickness of the oxynitride film formed on each of the plurality of substrates is adjusted by controlling the flow rate of the inert gas.

12. The method according to claim 11, wherein in at least one of (a) and (c), the inert gas is supplied from the plurality of inert gas supply parts to the plurality of zones, respectively, and flow rates of the inert gas supplied from the plurality of inert gas supply parts are controlled individually.

13. The method according to claim 12, wherein the plurality of inert gas supply parts is installed to correspond to the plurality of zones, respectively.

14. The method according to claim 13, wherein in at least one of (a) and (c), the inert gas whose flow rate is controlled is not supplied from each of the plurality of inert gas supply parts to non-corresponding zones, among the plurality of zones, to which the each of the plurality of inert gas supply parts does not correspond.

15. The method according to claim 12, wherein in at least one of (a) and (c), the thickness of the oxynitride film formed on each of the plurality of substrates is adjusted for each of the plurality of zones by controlling the flow rate of the inert gas supplied to each of the plurality of zones.

16. A substrate processing apparatus, comprising:

a process chamber in which a plurality of substrates is processed;

a precursor supply system configured to supply a precursor from a precursor supply part to the plurality of substrates in the process chamber;

an oxidizing agent supply system configured to supply an oxidizing agent from an oxidizing agent supply part to the plurality of substrates in the process chamber;

a nitriding agent supply system configured to supply a nitriding agent from a nitriding agent supply part to the plurality of substrates in the process chamber;

an inert gas supply system configured to supply inert gas from a plurality of inert gas supply parts, which is different from the oxidizing agent supply part, to the plurality of substrates in the process chamber; and a controller configured to control the precursor supply system, the oxidizing agent supply system, the nitriding agent supply system, and the inert gas supply system so as to perform a process in the process chamber, the process comprising:

forming an oxynitride film on each of the plurality of substrates by performing a cycle a predetermined number of times, the cycle including non-simultaneously performing:

(a) supplying the precursor from the precursor supply part to the plurality of substrates;

(b) supplying the oxidizing agent from the oxidizing agent supply part to the plurality of substrates; and (c) supplying the nitriding agent from the nitriding agent supply part to the plurality of substrates, wherein in (b), the inert gas is supplied from the plurality of inert gas supply parts to the plurality of substrates, and at least one of nitrogen concentration and refractive index of the oxynitride film formed on each of the plurality of substrates is adjusted by controlling a flow rate of the inert gas, wherein the act of forming the oxynitride film is performed in a state in which the plurality of substrates is arranged in a substrate arrangement region that is divided into a plurality of zones in a vertical direction, and wherein in (b), the inert gas is supplied from the plurality of inert gas supply parts to the plurality of zones, respectively, and flow rates of the inert gas supplied from the plurality of inert gas supply parts are controlled individually.

17. A non-transitory computer-readable recording medium storing a program that causes, by a computer, a substrate processing apparatus to perform a process in a process chamber of the substrate processing apparatus, the process comprising:

forming an oxynitride film on each of a plurality of substrates by performing a cycle a predetermined number of times, the cycle including non-simultaneously performing:

(a) supplying a precursor from a precursor supply part to the substrate;

(b) supplying an oxidizing agent from an oxidizing agent supply part to the plurality of substrates,and (c) supplying a nitricling agent from a nitricling agent supply part to the plurality of substrates, wherein in (b), inert gas is supplied from a plurality of inert gas supply parts, which is different from the oxidizing agent supply part, to the plurality of substrates, and at least one of nitrogen concentration and refractive index of the oxynitride film formed on each of the plurality of substrates is adjusted by controlling a flow rate of the inert gas, wherein the act of forming the oxynitride film is performed in a state in which the plurality of substrates is arranged in a substrate arrangement region that is divided into a plurality of zones in a vertical direction, and wherein in (b), the inert gas is supplied from the plurality of inert gas supply parts to the plurality of zones, respectively, and flow rates of the inert gas supplied from the plurality of inert gas supply parts are controlled individually.

\* \* \* \* \*